United States Patent
Ohkubo

[11] Patent Number: 6,127,708
[45] Date of Patent: Oct. 3, 2000

[54] SEMICONDUCTOR DEVICE HAVING AN INTERVENING REGION BETWEEN CHANNEL STOPPER AND DIFFUSION REGION

[75] Inventor: Hiroaki Ohkubo, Tokyo, Japan

[73] Assignee: NEC Corporation, Tokyo, Japan

[21] Appl. No.: 09/228,681

[22] Filed: Jan. 12, 1999

Related U.S. Application Data

[62] Division of application No. 08/839,947, Apr. 24, 1997, abandoned.

[30] Foreign Application Priority Data

Apr. 25, 1996 [JP] Japan .................................. 8-105597

[51] Int. Cl.$^7$ .................................................. H01L 29/772
[52] U.S. Cl. ............................................ 257/399; 257/648
[58] Field of Search ................................. 257/647, 648, 257/399, 400

[56] References Cited

U.S. PATENT DOCUMENTS

| | | | |
|---|---|---|---|
| 4,315,781 | 2/1982 | Henderson | 247/400 |
| 4,372,033 | 2/1983 | Chiao . | |
| 4,476,621 | 10/1984 | Bopp et al. | 257/648 |
| 4,502,914 | 3/1985 | Trumpp et al. . | |
| 4,644,386 | 2/1987 | Nishizawa et al. | 257/400 |
| 4,707,218 | 11/1987 | Giammarco et al. . | |
| 4,838,991 | 6/1989 | Cote et al. . | |
| 5,672,995 | 9/1997 | Hirase et al. . | |
| 5,696,400 | 12/1997 | Yoshida et al. | 257/648 |
| 5,789,789 | 8/1998 | Hayakawa | 257/376 |

FOREIGN PATENT DOCUMENTS

| | | |
|---|---|---|
| 60-74454 | 4/1985 | Japan . |
| 61-183939 | 8/1986 | Japan . |
| 11-94436 | 8/1989 | Japan . |
| 22673 | 1/1990 | Japan . |
| 5283519 | 10/1993 | Japan . |
| 6-29383 | 2/1994 | Japan . |

*Primary Examiner*—David Hardy
*Attorney, Agent, or Firm*—Sughrue, Mion, Zinn, Macpeak & Seas, PLLC

[57] ABSTRACT

In a method for manufacturing a semiconductor device, an anti-oxidation layer is formed on a semiconductor substrate of a first conductivity type. Then, a first photoresist pattern layer for defining an active area is formed on the anti-oxidation layer, and the anti-oxidation layer is etched by using the first photoresist pattern layer as a mask. Then, a second photoresist pattern layer is formed on a part of the first photoresist pattern layer. In this case, a width of the second photoresist pattern layer is larger than a width of the part of the first photoresist pattern layer. Then, ions of the first conductivity type are introduced into the semiconductor substrate by using the first and second photoresist pattern layers as a mask. Then, the semiconductor substrate is thermally oxidized by using the anti-oxidation layer as a mask to form a semiconductor oxide layer while activating the ions to form a channel stopper region below the semiconductor oxide layer.

1 Claim, 50 Drawing Sheets

US 6,127,708

SEMICONDUCTOR DEVICE HAVING AN INTERVENING REGION BETWEEN CHANNEL STOPPER AND DIFFUSION REGION

This is a divisional of application Ser. No. 08/839,947 filed Apr. 24, 1997, now abandoned, the disclosure of which is incorporated herein by reference.

BACKGROUND OF THE INVENTION

1. Field of the Invention

The present invention relates to a method for manufacturing a semiconductor device, and more particularly, to an improvement of a channel stopper region.

2. Description of the Related Art

Generally, in a semiconductor device, a field silicon oxide layer formed by a local oxidation of silicon (LOCOS) process partitions active areas of a semiconductor substrate (or well). Also, a channel stopper region having a higher impurity concentration of the same conductivity type as that of the semiconductor substrate is provided in the semiconductor substrate beneath the field silicon oxide layer. The channel stopper region enhances the threshold voltage of a parasitic MOS transistor formed by the semiconductor substrate, the field oxide layer and its overlying wiring layer, and enhances the punch-through breakdown voltage between impurity diffusion regions sandwiching the field silicon oxide layer, thus improving the isolation characteristics.

In a prior art method for forming a channel stopper region, the channel stopper region is formed in alignment with a field silicon oxide layer. In other words, the area of the channel stopper region coincides with that of the field silicon oxide layer. This will be explained later in detail.

In the prior art method, however, when an impurity diffusion region of an opposite conductivity type to that of the semiconductor substrate is provided so as to be in contact with a conductive contact plug, the impurity diffusion region is in contact with the channel stopper region. As a result, a capacitance caused by a PN junction formed by the channel stopper region and the impurity diffusion region which both have relatively high impurity concentrations is remarkably increased. This increases the parasitic capacitance of a conductive layer connected Lo this PN junction, thus reducing the operation of the device.

SUMMARY OF THE INVENTION

It is an object of the present invention to provide a method for manufacturing a semiconductor device capable of reducing the parasitic capacitance of a conductive layer connected via a contact hole to an impurity diffusion region.

According to the present invention, in a method for manufacturing a semiconductor device, an anti-oxidation layer is formed on a semiconductor substrate of a first conductivity type. Then, a first photoresist pattern layer for defining an active area is formed on the anti-oxidation layer, and the anti-oxidation layer is etched by using the first photoresist pattern layer as a mask. Then, a second photoresist pattern layer is formed on a part of the first photoresist pattern layer. In this case, a width of the second photoresist pattern layer is larger than a width of the part of the first photoresist pattern layer. Then, ions of the first conductivity type are introduced into the semiconductor substrate by using the first and second photoresist pattern layers as a mask. Then, the semiconductor substrate is thermally oxidized by using the anti-oxidation layer as a mask to form a semiconductor oxide layer while activating the ions to form a channel stopper region below the semiconductor oxide layer.

In another aspect of the present invention, an anti-oxidation layer is formed on a semiconductor substrate of a first conductivity type, and a first photoresist pattern layer for defining an active area is formed on the anti-oxidation layer. Then, the anti-oxidation layer is etched by using the first photoresist pattern layer as a mask. Then, the semiconductor substrate is thermally oxidized by using the anti-oxidation layer as a mask to form a semiconductor oxide layer. Then, the anti-oxidation layer is removed, and a second photoresist pattern layer is formed on a part of the active area. In this case, a width of the second photoresist pattern layer is larger than that of the active area. Then, ions of the first conductivity type are introduced into the semiconductor substrate by using the second photoresist pattern layer as a mask. Finally, the ions of the first conductivity type are activated to form a channel stopper region below the semiconductor oxide layer.

Thus, the area of the channel stopper region is smaller than that of the field insulating layer, and therefore, an impurity diffusion region connected via a contact hole to an overlying conductive layer is hardly in contact with the channel stopper region.

BRIEF DESCRIPTION OF THE DRAWINGS

The present invention will be more clearly understood form the description as set forth below, as compared with the prior art, with reference to the accompanying drawings, wherein.

DESCRIPTION OF THE PREFERRED EMBODIMENTS

Before the description of the preferred embodiments, a prior art method for manufacturing an SRAM device will be explained with reference to FIGS. 1, 2A, 2B, 2C, 3A, 3B, 3C, 4A, 4B, 4C, 5A, 5B, 5C, 6A, 6B, 6C, 7A, 7B, 7C, 8A, 8B, 8C and 9.

Figure 1:
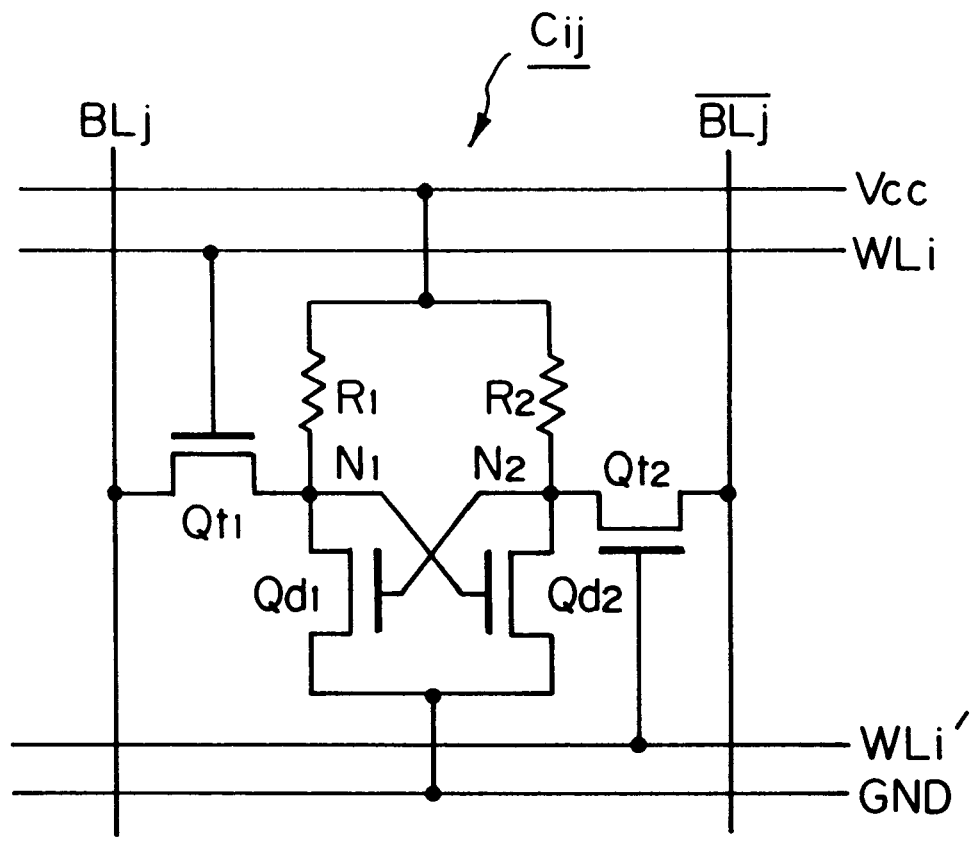
FIG. 1 is an equivalent circuit diagram illustrating a prior art SRAM cell.

In FIG. 1, which is an equivalent circuit diagram illustrating an SRAM cell, one SRAM cell $C_{ij}$ is provided at an intersection between a word line $WL_i$ ($WL_i'$) and two complementary bit lines $BL_j$ and $\overline{BL}_j$. This memory cell is constructed by a flip-flop formed by two cross-coupled inverters and transfer N-channel MOS transistors $Q_{t1}$ and $Q_{t2}$ connected between nodes $N_1$ and $N_2$ of the flip-flop and the data lines $BL_j$ and $\overline{BL}_j$.

The transfer transistors $Q_{t1}$ and $Q_{t2}$ are controlled by the voltages at the word line $WL_i$ and $WL_i'$, respectively. In this case, note that the voltage at the word line $WL_i$ is the same as that the word line $WL_i'$.

Each of tile inverters includes a load resistor $R_1$ ($R_2$) and a drive N-channel. MOS transistor $Q_{d1}$ ($Q_{d2}$) between a high power supply line $V_{cc}$ and a low power supply (ground) line GND. The node $N_1$ is connected to a gate of the drive transistor $Q_{d2}$, so that the drive transistor $Q_{d2}$ is driven by the voltage at the node $N_1$. Also, the node $N_2$ is connected to a gate of the drive transistor $Q_{d1}$, so that the drive transistor $Q_{d1}$ is driven by the voltage at the node $N_2$.

Generally, the transistors $Q_{t1}$, $Q_{t2}$, $Q_{d1}$ and $Q_{d2}$ are formed on a principal surface of a semiconductor substrate, and the load resistors $R_1$ and $R_2$ are made of polycrystalline silicon or semi-insulated polycrystalline silicon (SIPOS).

The structure of the SIAM cell of FIG. 1 is explained next with reference to FIGS. 2A, 2B, 2C, 3A, 3B, 3C, 4A, 4B, 4C, 5A, 5B, 5C, 6A, 6B, 6C, 7A, 7B, 7C, 8A, 8B, 8C and 9 which show manufacturing steps thereof. Note that FIGS. 2B, 3B, 4B, 5B, 6B, 7B and 8B are cross-sectional views taken along the line B—B of FIGS. 2A, 3A, 4A, 5A, 6A, 7A and 8A, respectively, and FIGS. 2C, 3C, 4C, 5C, 6C, 7C and 8C are cross-sectional views taken along the line C—C of FIGS. 2A, 3A, 4A, 5A, 6A, 7A and 8A, respectively.

Figure 2A:
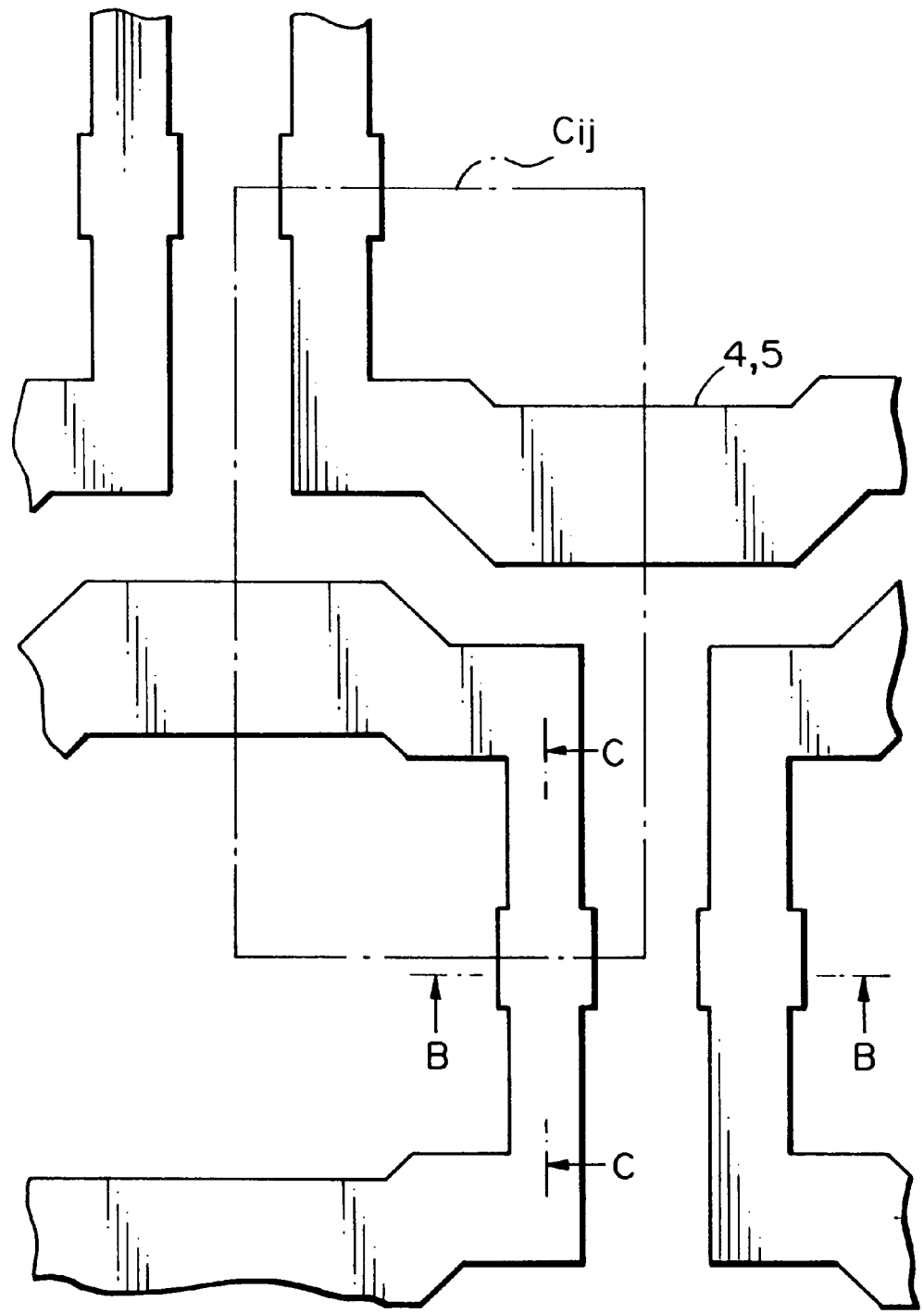
FIGS. 2A, 3A, 4A, 5A, 6A, 7A and 8A are plan views for explaining a prior art method for manufacturing an SRAM device.
Figure 2B:
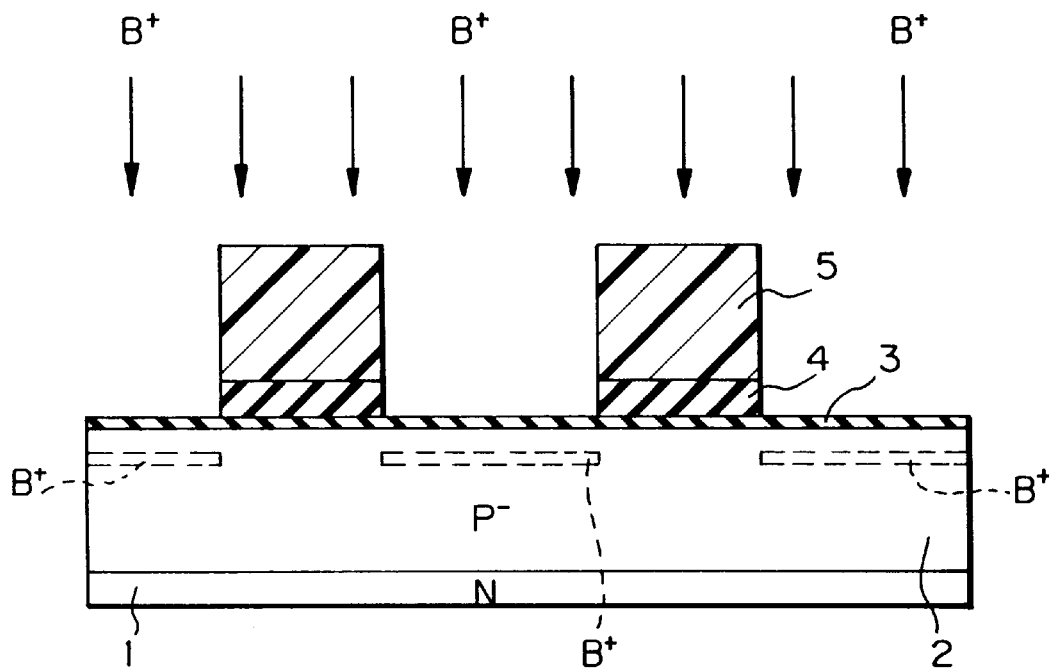
FIGS. 2B, 3B, 4B, 5B, 6B, 7B and 8B are cross-sectional views taken along the line B—B of FIGS. 2A, 3A, 4A, 5A, 6A, 7A and 8A, respectively.
Figure 2C:
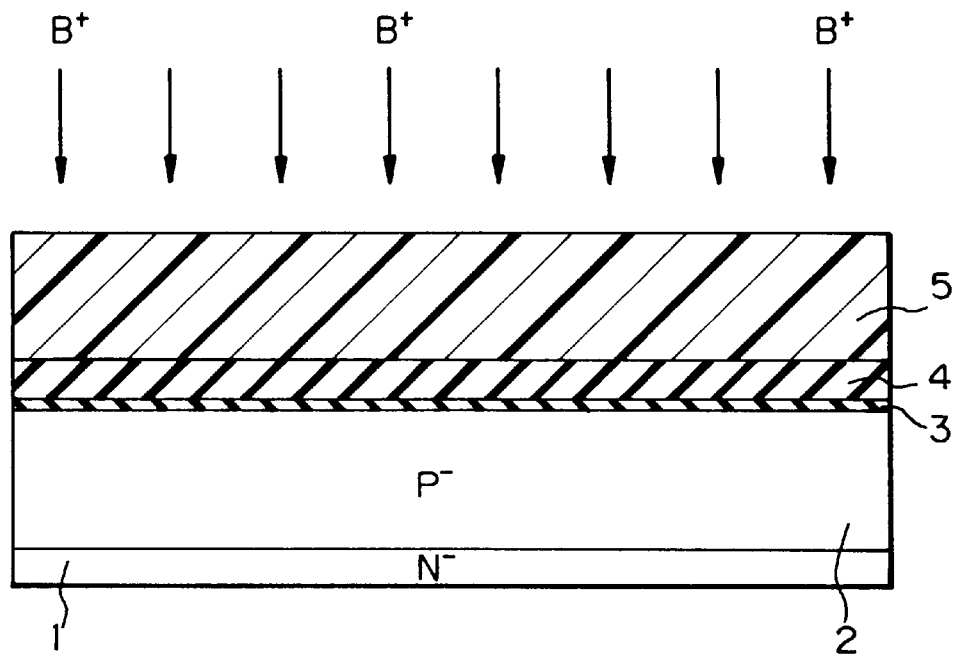
FIGS. 2C, 3C, 4C, 5C, 6C, 7C and 8C are cross-sectional views taken along the line C—C of FIGS. 2A, 3A, 4A, 5A, 6A, 7A and 8A, respectively.

First, referring to FIGS. 2A, 2B and 2C, a P⁻-type well 2 having an impurity concentration of about $10^{15}/cm^3$ is grown on an N⁻-type monocrystalline silicon substrate 1 having an impurity concentration of about $10^{15}/cm^3$. Then, the P⁻-type well 2 is thermally oxidized to form an about 5 to 20 nm thick silicon oxide layer 3, and thereafter, an about 50 to 300 nm thick silicon nitride layer 4 as an anti-oxidation layer is deposited by a chemical vapor deposition (CVD) process on the silicon oxide layer 3. In this case, note that the P⁻-type well 2 can be also a kind Of semiconductor substrate.

Then, a photoresist pattern 5 for defining an active area is formed, and the silicon nitride layer 4 is patterned by an anisotropic etching process using the photoresist pattern 5 as a mask.

Then, boron ions are implanted into the P⁻-type well 2 by using the photoresist pattern 5 as a mask.

Note that a peripheral circuit is usually formed by a CMOS circuit, and therefore, an N⁻-type well is also formed on the silicon substrate 1. In this case, another photoresist pattern also covers the N⁻-type well.

Then, the photoresist pattern 5 is removed.

Figure 3A:
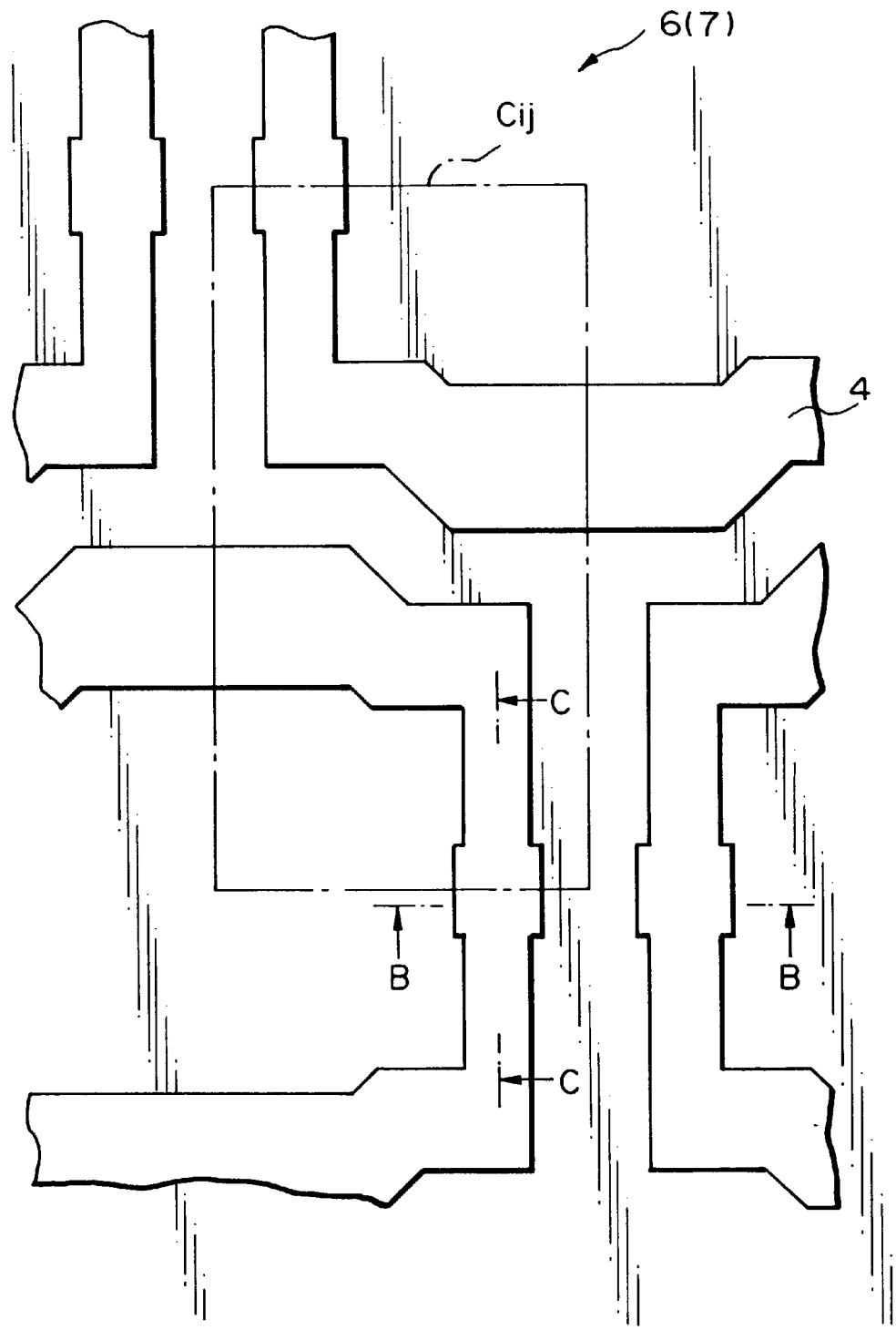
Figure 3B:
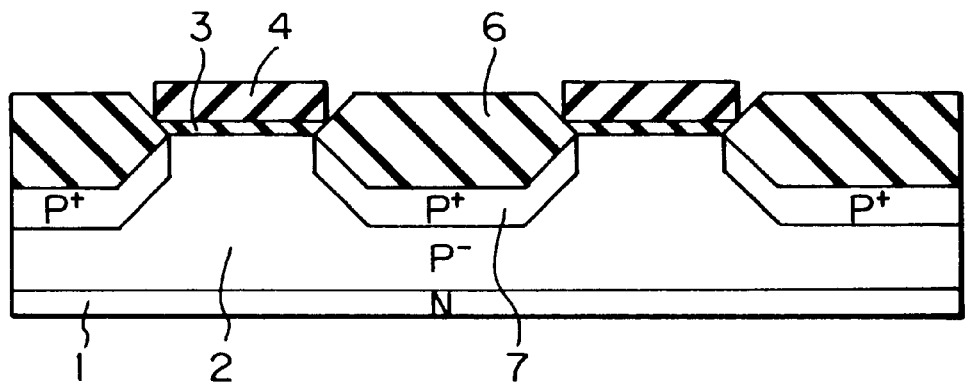
Figure 3C:
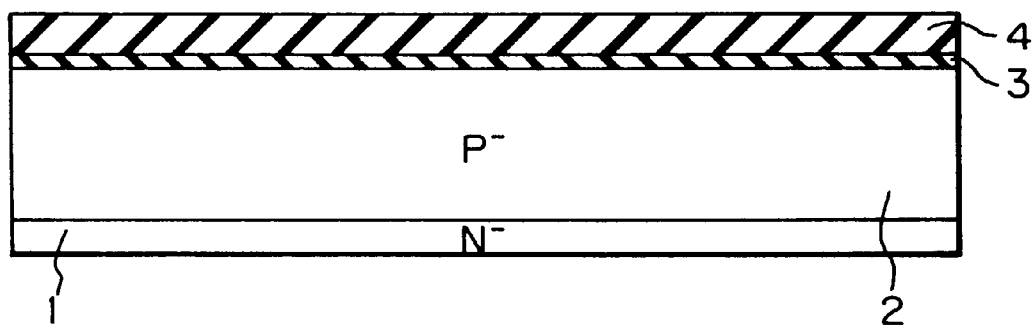

Next, referring to FIGS. 3A, 3B and 3C, the P⁻-type well 2 is thermally oxidized by using the silicon nitride layer 4 as a mask, so that an about 200 to 500 run thick field silicon oxide layer 6 is formed in a field area. This is called a LOCOS process. In this case, boron ions in the P⁻-type well 2 are simultaneously activated, so that a P⁺-type channel stopper region 7 is formed in self-alignment with the field silicon oxide layer 6. Then, the silicon nitride layer 4 and the silicon oxide layer 3 are removed.

Figure 4A:
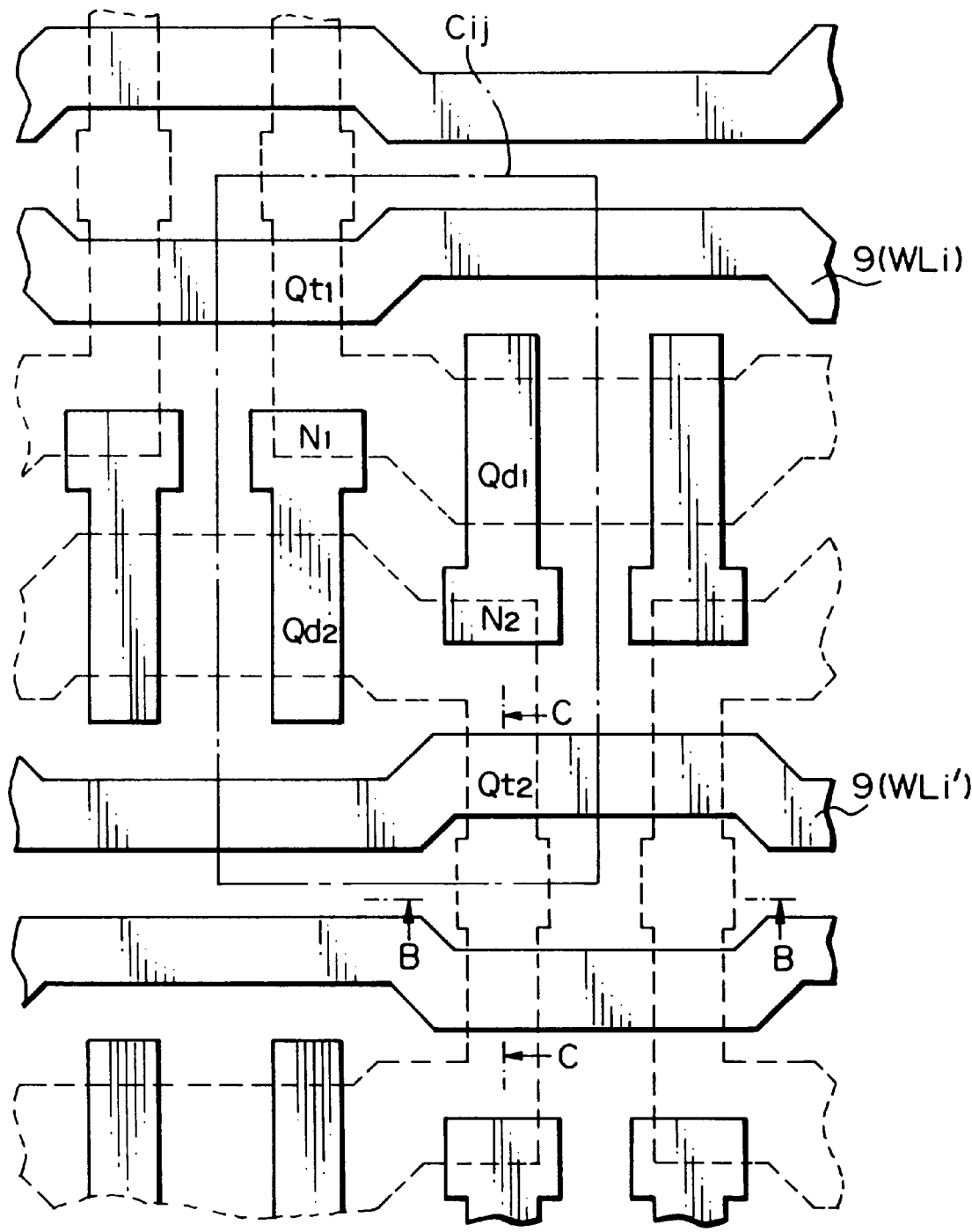
Figure 4B:
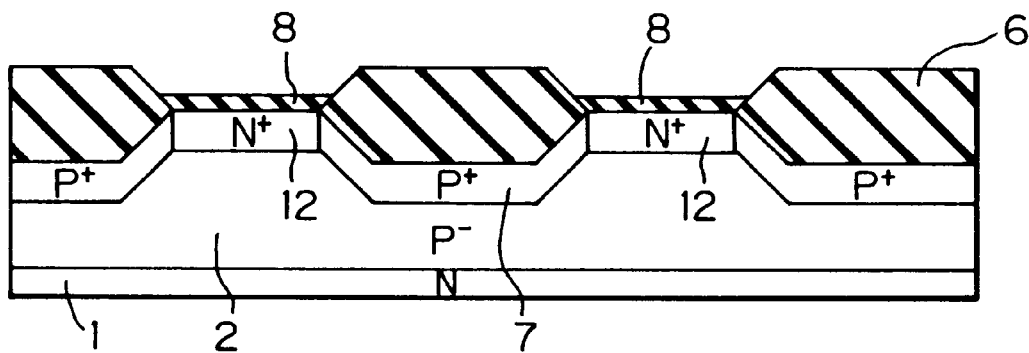
Figure 4C:
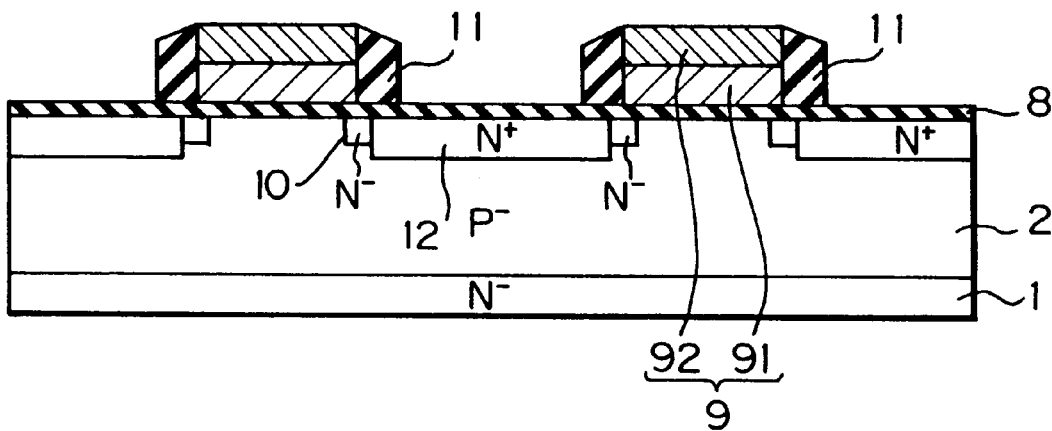

Next, referring to FIGS. 4A, 4B and 4C, a gate silicon oxide layer 8 is formed by thermally oxidizing the P⁻-type well 2. Then, a gate electrode layer 9 formed by a polycrystalline silicon layer 91 and a tungsten silicide layer 92 is formed on the gate silicon oxide layer 8 and the field silicon oxide layer 6. Note that the gate electrode layer 9 also forms word lines $WL_i$ and $WL_i'$. Then, phosphorous ions are implanted into the P⁻-type well 2 using the gate electrode layer 9 as a mask to form N⁻-type impurity diffusion regions 10 of a lightly-doped drain (LDD) configuration. Then, a silicon oxide layer is formed on the entire surface, and an isotropic etching operation is performed upon the silicon oxide layer to form sidewall silicon oxide layers 11. Then, arsenic ions are implanted into the substrate 1 using the sidewall silicon oxide layers 6 as a mask to form N⁺-type impurity diffusion regions 12 of the LDD configuration.

Figure 5A:
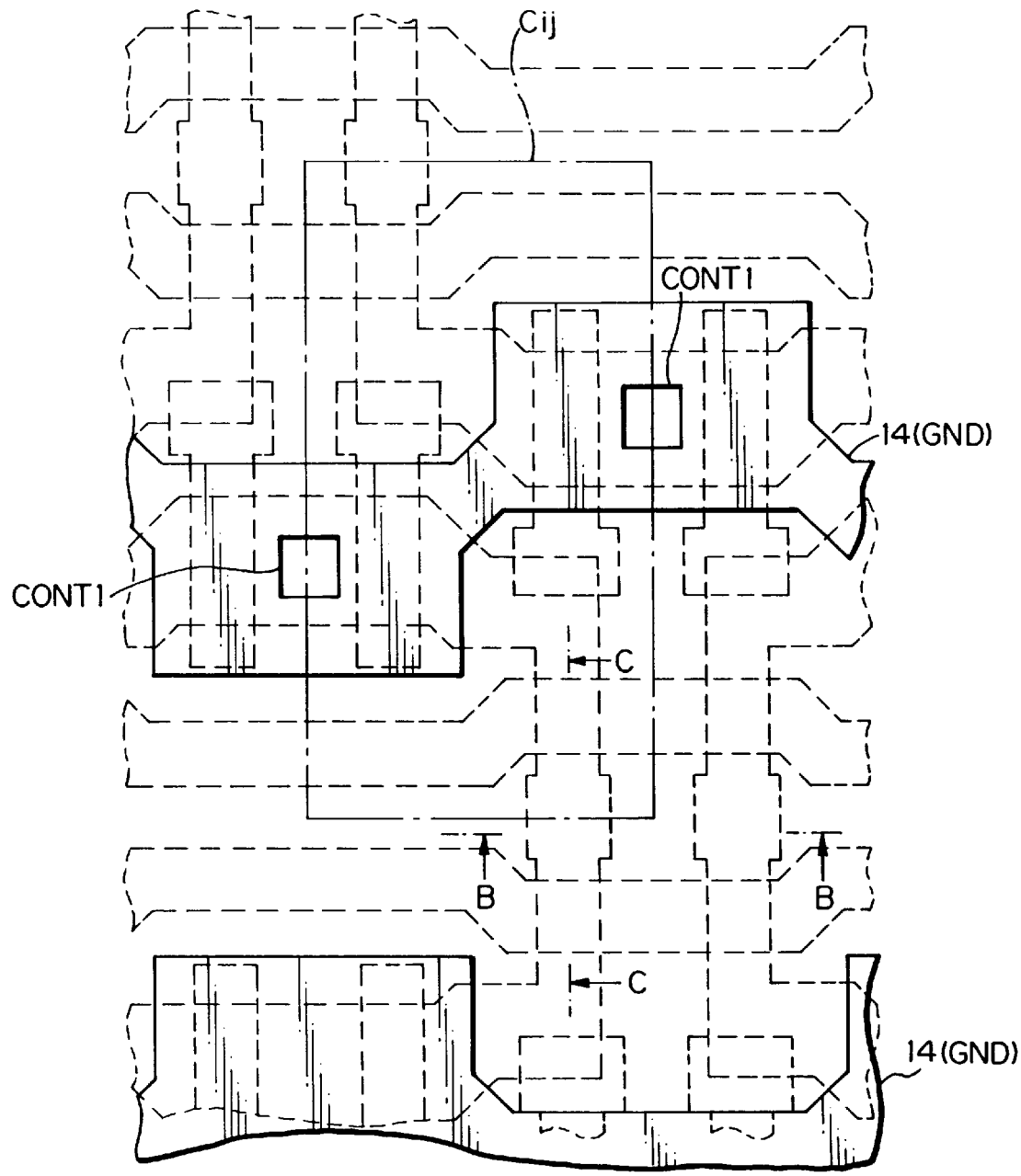
Figure 5B:
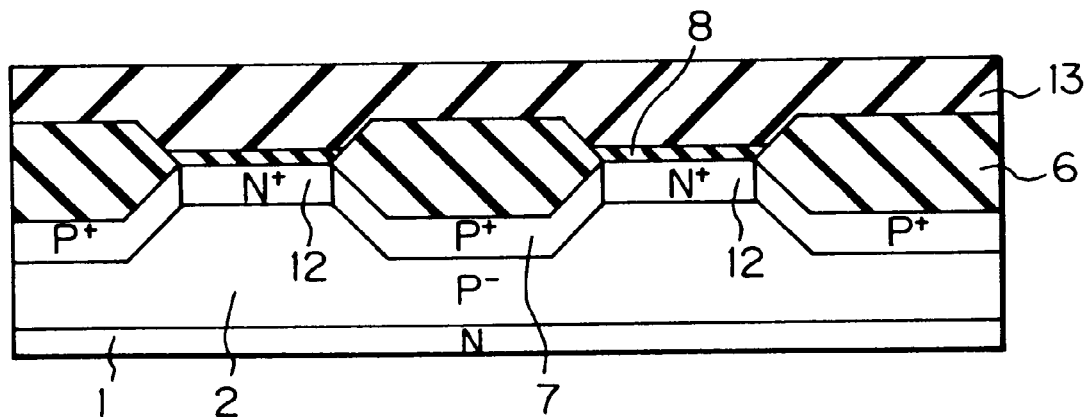
Figure 5C:
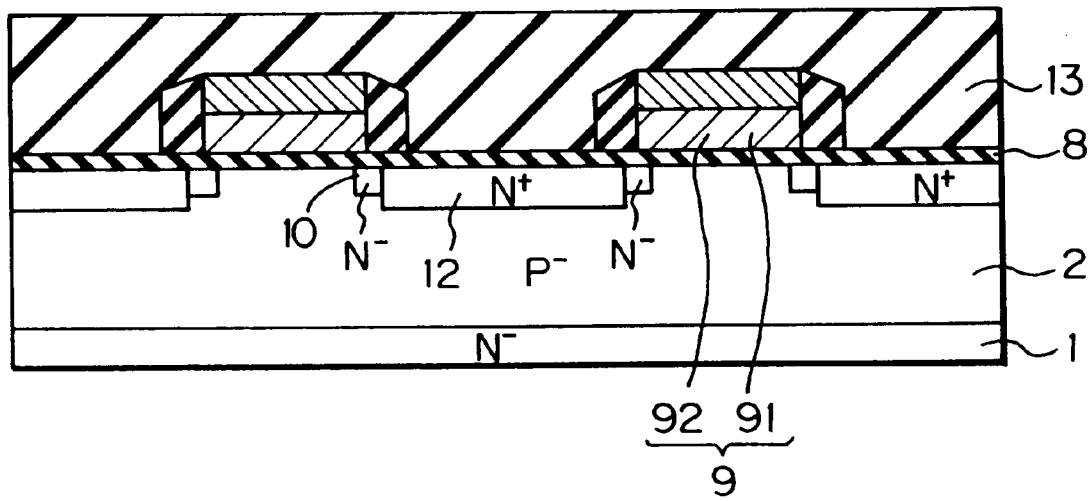

Next, referring to FIGS. 5A, 5B and 5C, a silicon oxide layer 13 is deposited on the entire surface by a CVD process, and contact holes CONT1 are perforated in the silicon oxide layer 13. Then, a tungsten silicide layer 14 is formed on the silicon oxide layer 13 by a sputtering process, and is patterned to form a ground line GND. In this case, the ground line GND is connected via the contact holes CONT1 to the sources (the N⁺-type impurity regions 12) of the drive transistors $Q_{d1}$ and $Q_{d2}$.

Figure 6A:
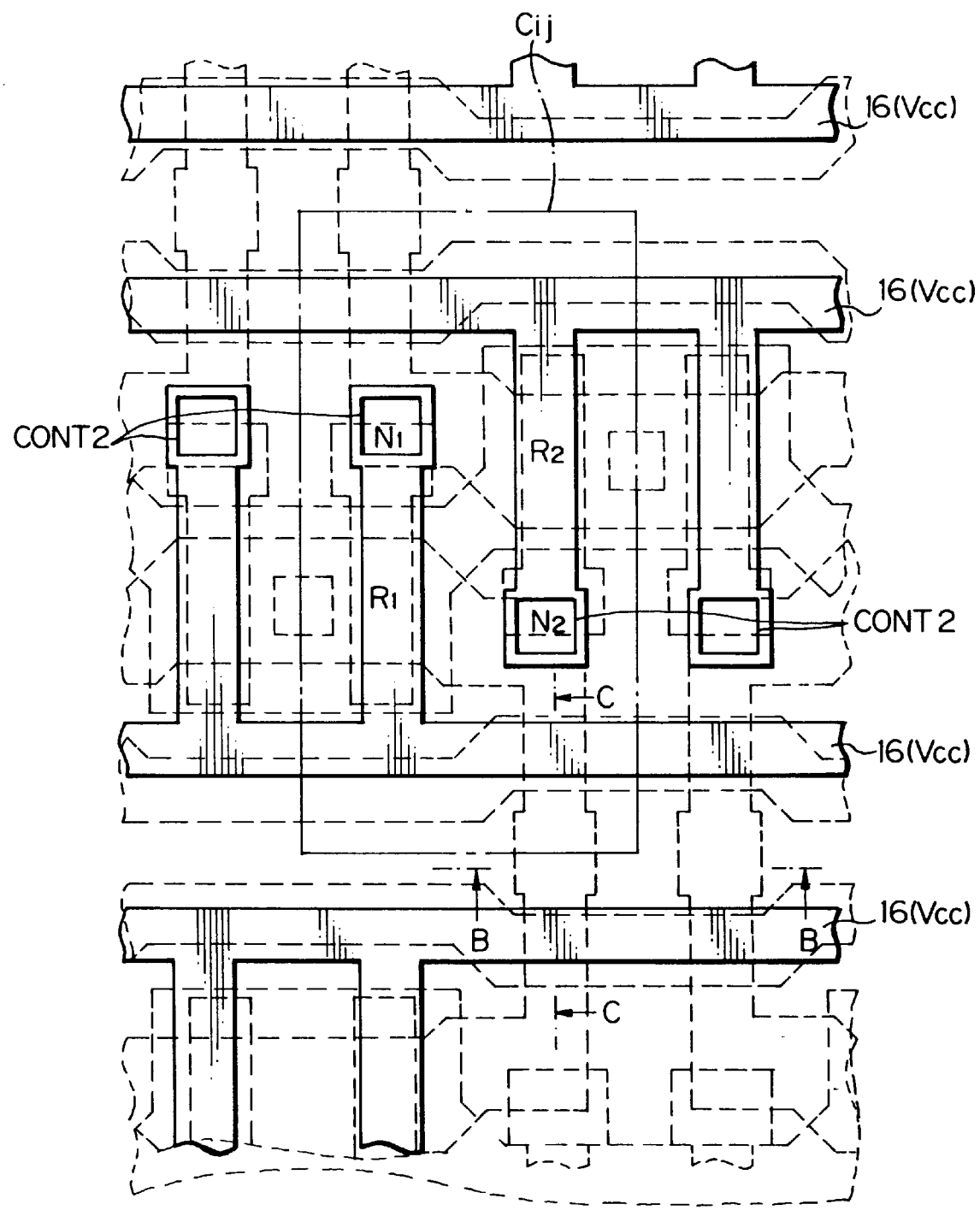
Figure 6B:
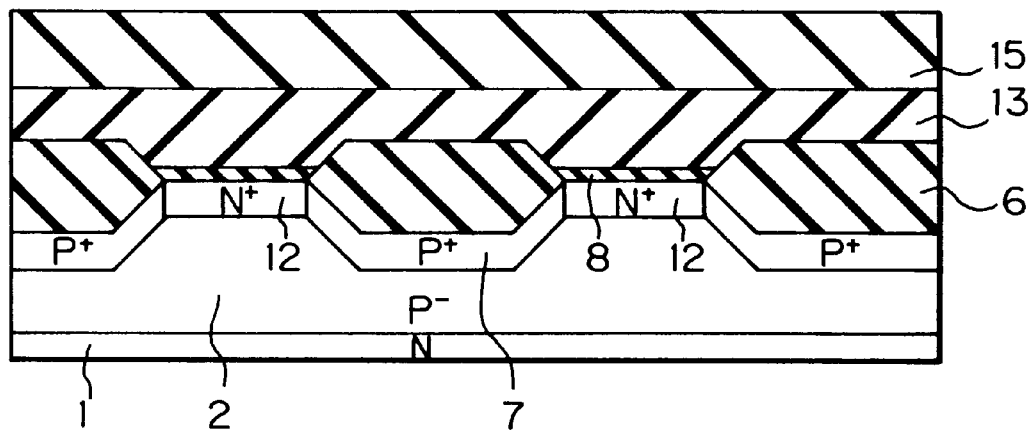
Figure 6C:
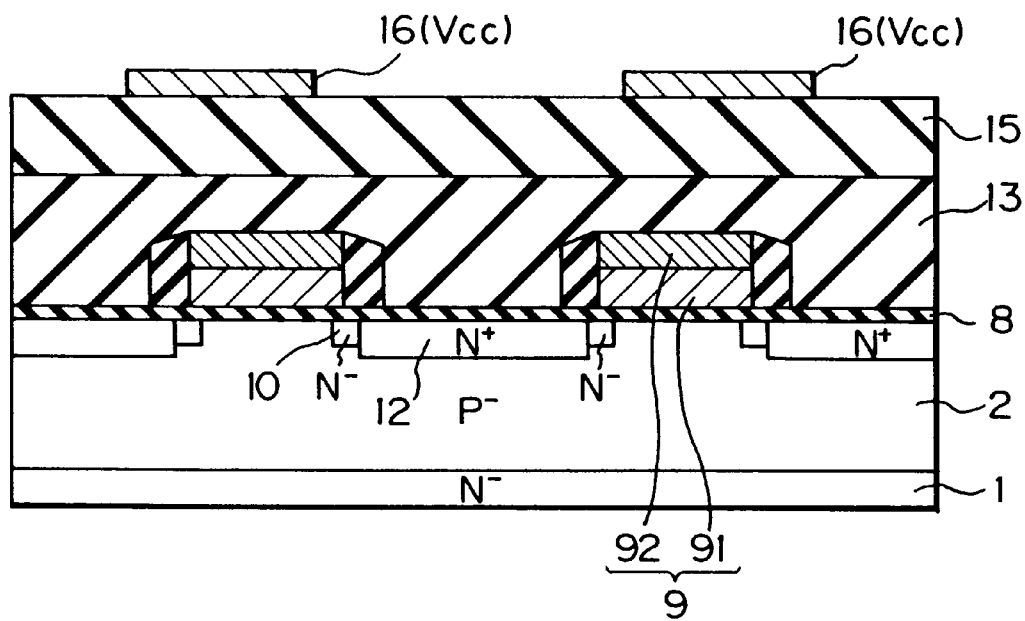

Next, referring to FIGS. 6A, 6B and 6C, a silicon oxide layer 15 is deposited on the entire surface by a CVD process, and contact holes CONT2 are perforated in the silicon oxide layers 15 and 13. Then, a polycrystalline silicon layer 16 is formed on the silicon oxide layer 15 by a CVD process, and is patterned to form a power supply line $V_{cc}$ and load resistors $R_1$ and $R_2$. In this case, the load resistors $R_1$ and $R_2$ are connected via the contact holes CONT2 to the nodes $N_1$ and $N_2$ as well as the gates of the drive transistors $Q_{d2}$ and $Q_{d1}$.

Figure 7A:
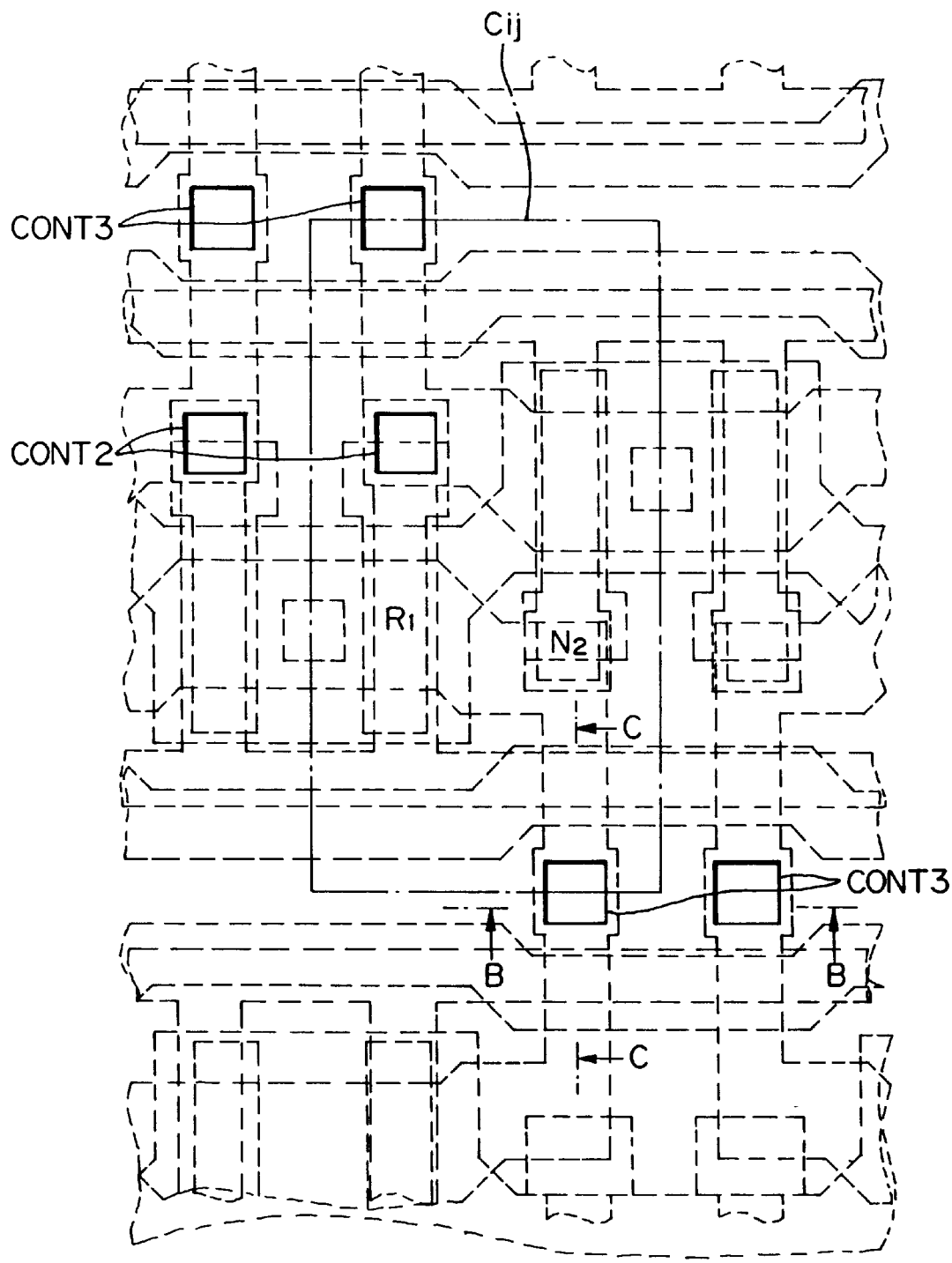
Figure 7B:
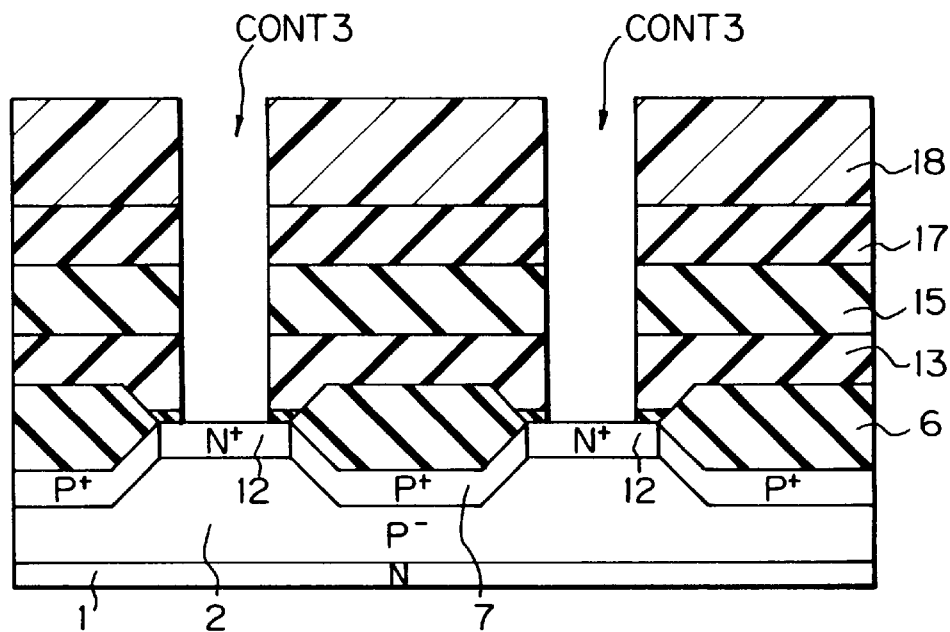
Figure 7C:
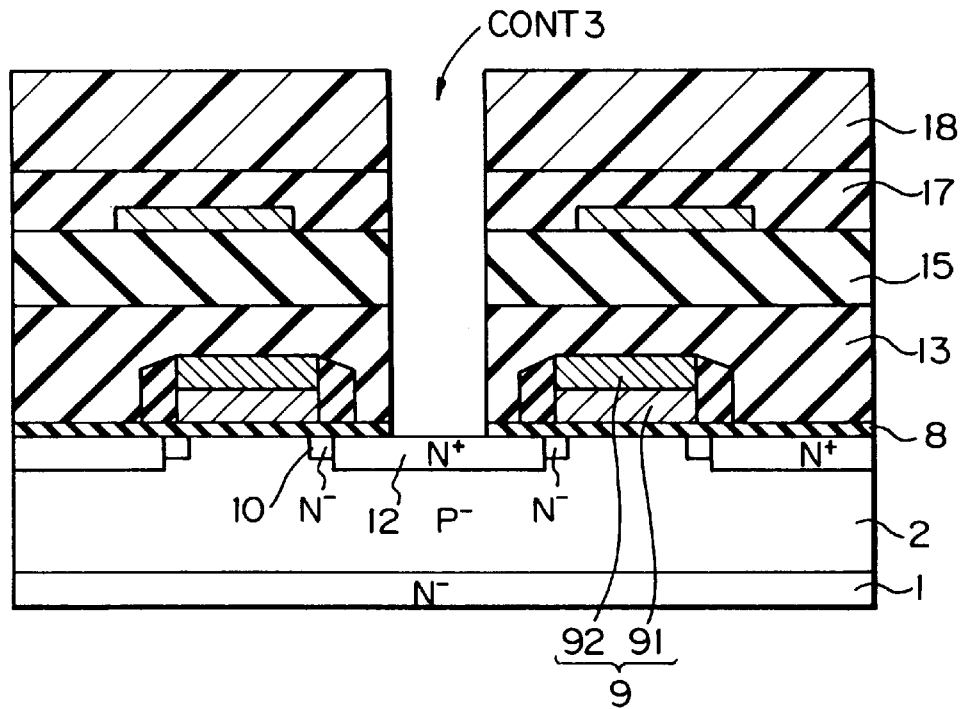

Next, referring to FIGS. 7A, 7B and 7C, a silicon oxide layer 17 is deposited on the entire surface by a CVD process. Then, a photoresist pattern 18 is formed and the silicon oxide layers 17, 15, 13 and 8 are anisotropically etched by using the photoresist pattern 18 as a mask to form contact holes CONT3. Then, the photoresist pattern 18 is removed.

Figure 8A:
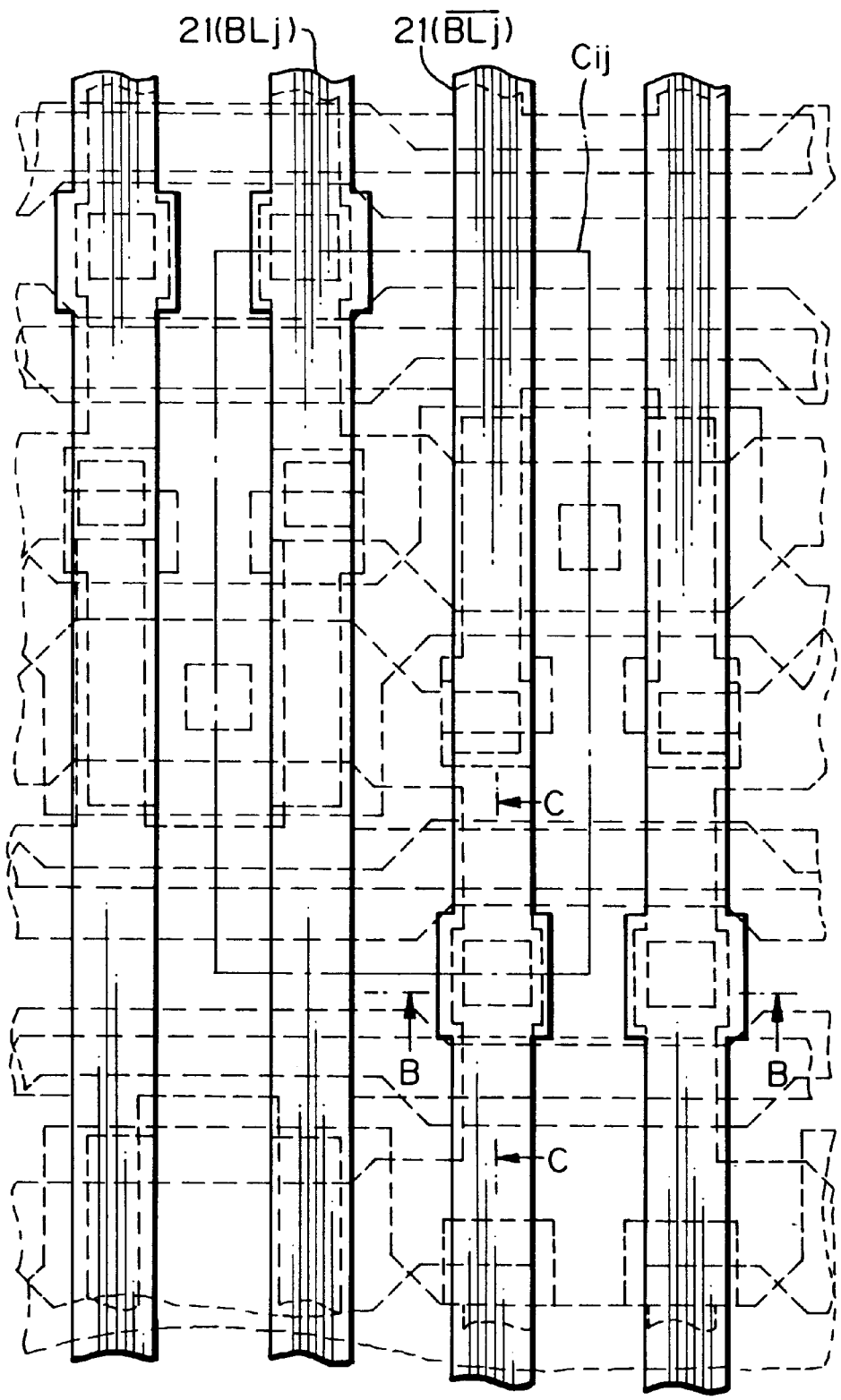
Figure 8B:
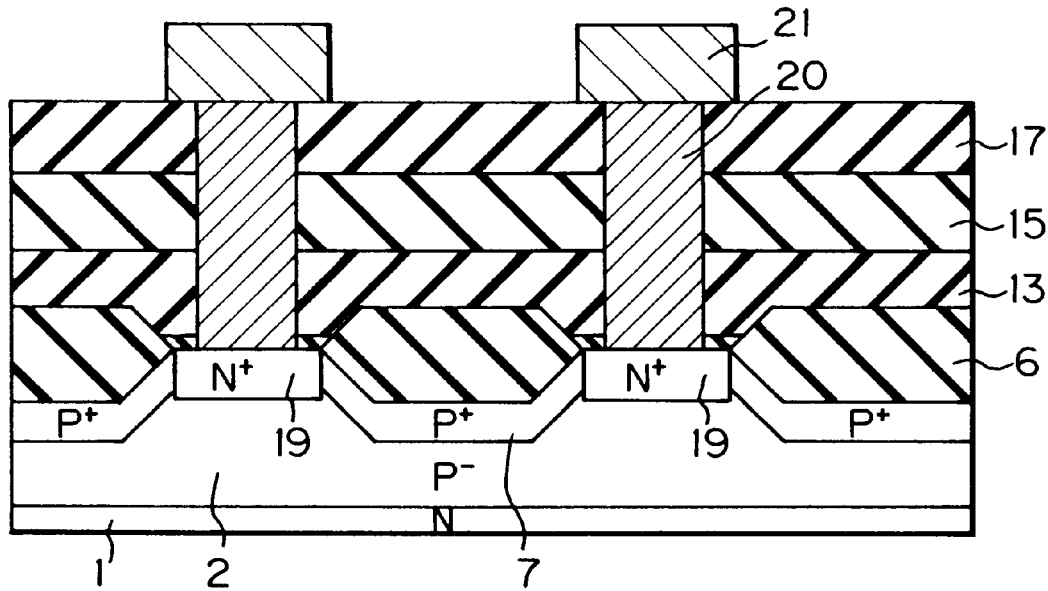
Figure 8C:
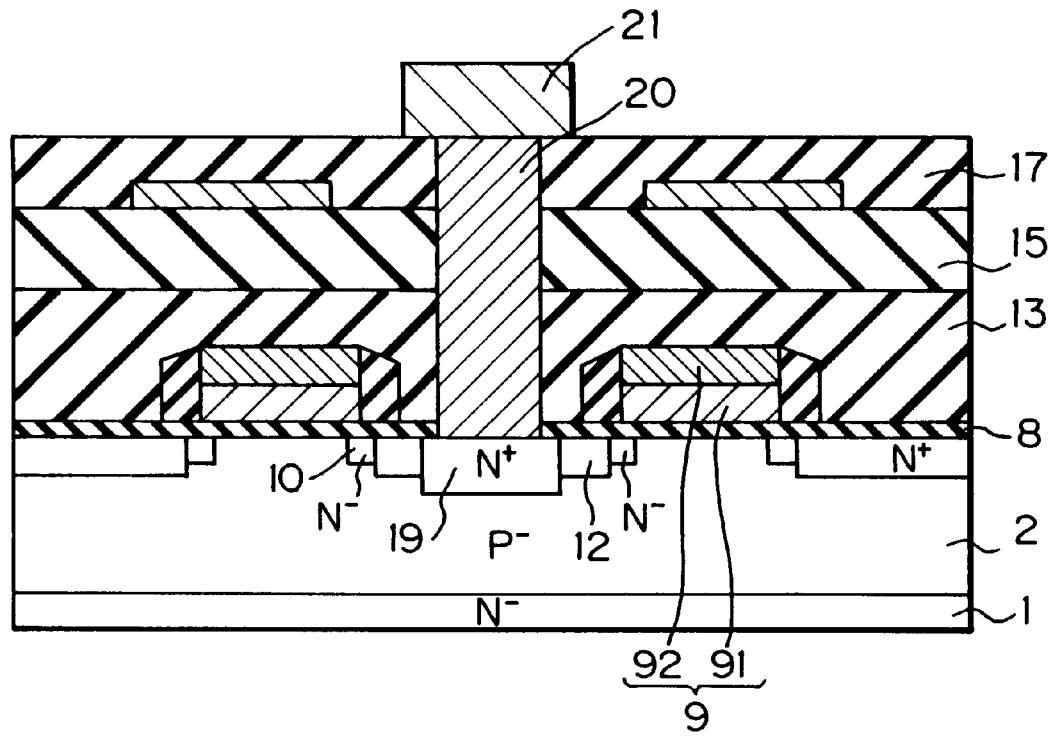

Finally, referring to FIGS. 8A, 8B and 8C, phosphorous ions are implanted into the P⁻-type well 2 by the silicon oxide layers 17, 15, 13 and 8 as a mask and the device is annealed, so that an N⁺-type impurity diffusion region 19 is formed. Then, a tungsten layer is formed by a sputtering process, and the tungsten layer is etched back by an anisotropic etching process, so that tungsten plugs 20 are buried in the contact holes CONT3.

Then, an aluminum layer 21 is deposited on the entire surface by a sputtering process, and the aluminum layer 21 is patterned to form bit lines $\overline{BL}_j$ and $BL_j$.

Figure 9:
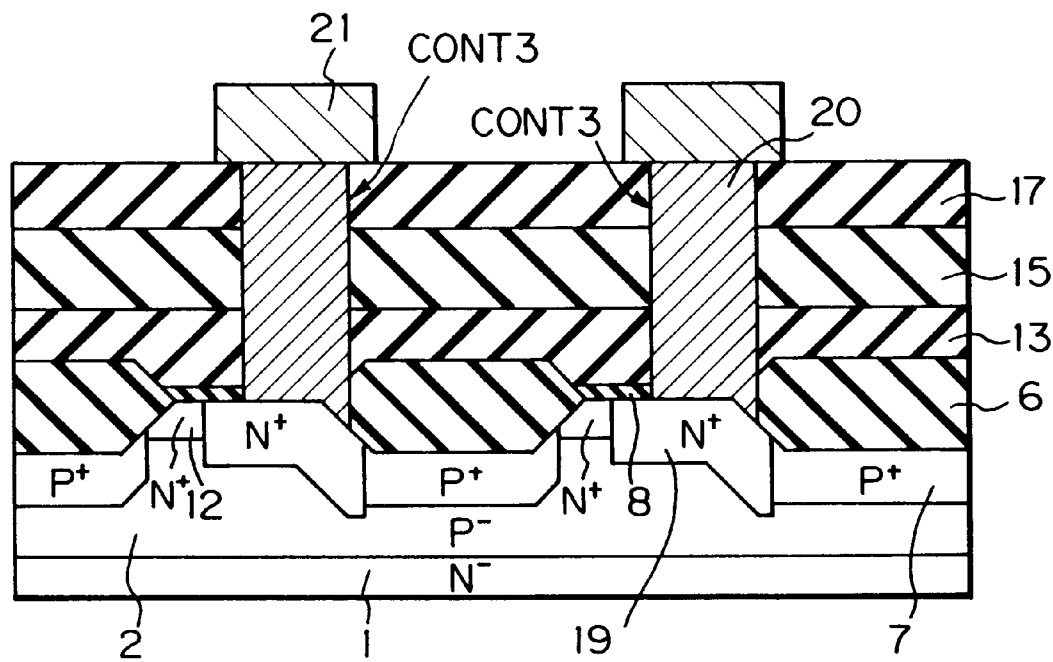
FIG. 9 is a cross-sectional view illustrating a modification of FIG. 8B.

In FIGS. 8A, 8B and 8C, the N⁺-type impurity diffusion region 19 prevents the tungsten plugs 20 from being short-circuited to the P+-type channel stopper region 7. For example, as illustrated in FIG. 9, which is a modification of FIG. 8B, even if the contact holes CONT3 are shifted from optimum locations, the N+-type impurity diffusion region 19 is always formed in self-alignment with the tungsten plugs 20. Therefore, the tungsten plugs 20 are never directly connected to the P+-type channel stopper region 7.

In the above-described prior art method, however, since the N+-type impurity diffusion region 19 is in contact with the P+-type channel stopper region 7, a capacitance caused by a PN junction formed by the P+-type channel stopper region 7 and the N+-type impurity diffusion region 19 which both have relatively high impurity concentrations is remarkably increased. This increases the parasitic capacitance of the aluminum layer 21 connected to this PN junction, thus reducing the operation of the device.

FIGS. 10A, 11A, 12A, 13A, 14A, 15A, 16A and 17A are plan views for explaining a first embodiment of the method for manufacturing an SRAM device according to the present invention, FIGS. 10B, 11B, 12B, 13B, 14B, 15B, 16B and 17B are cross-sectional views taken along the line B—B of FIGS. 10A, 11A, 12A, 13A, 14A, 15A, 16A and 17A, respectively, and FIGS. 10C, 11C, 12C, 13C, 14C, 15C, 16C and 17C are cross-sectional views taken along the line C—C of FIGS. 10A, 11A, 12A, 13A, 14A, 15A, 16A and 17A, respectively.

Figure 10A:
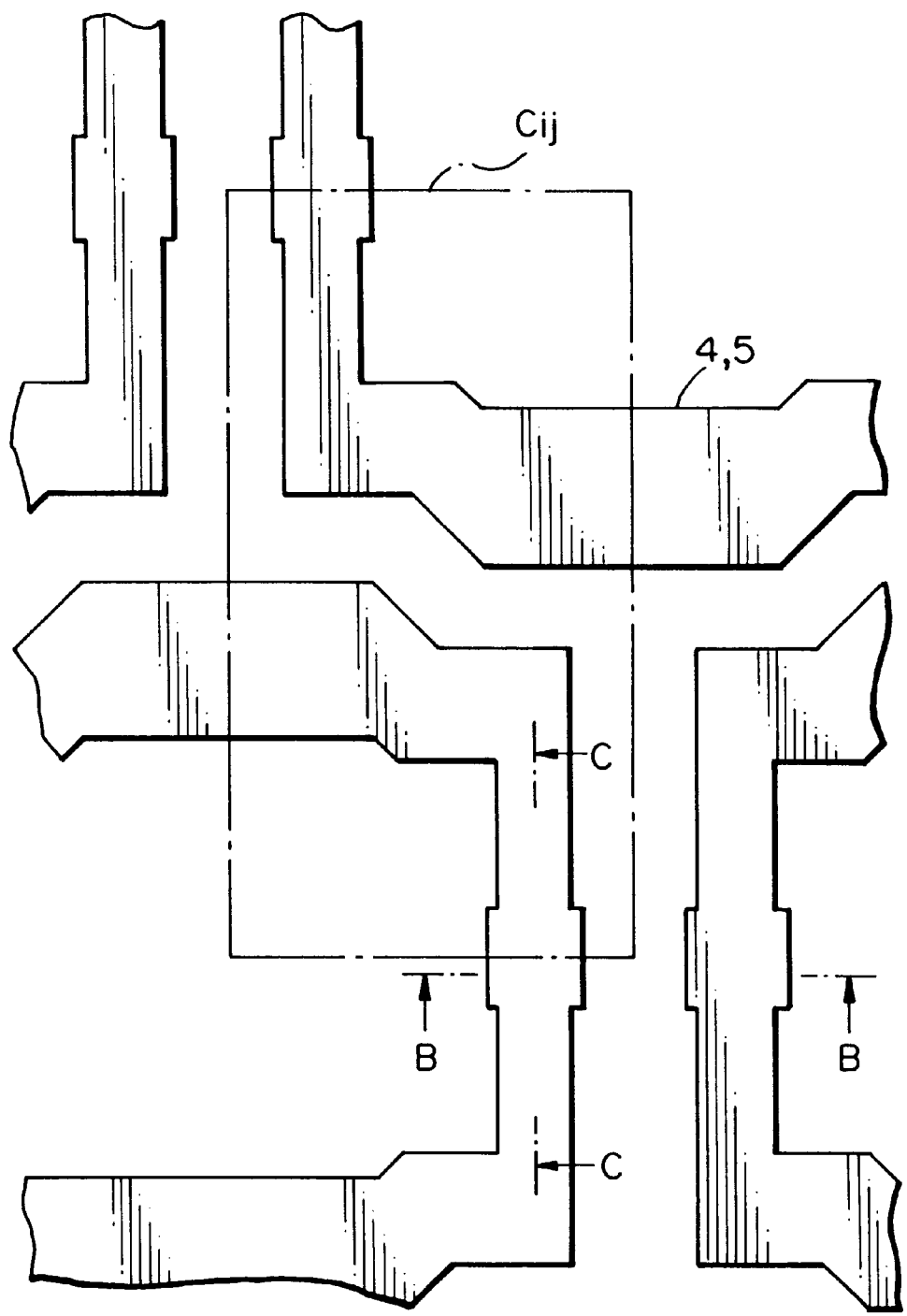
FIGS. 10A, 11A, 12A, 13A, 14A, 15A, 16A are 17A are plan views for explaining a first embodiment of the method for manufacturing an SRAM device according to the present invention.
Figure 10B:
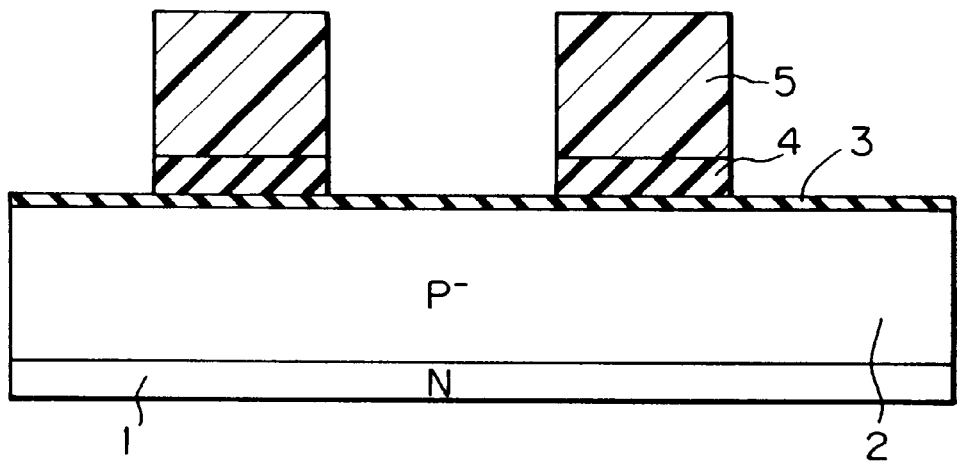
FIGS. 10B, 11B, 12B, 13B, 14B, 15B, 16B and 17B are cross-sectional views taken along the line B—B of FIGS. 10A, 11A, 12A, 13A, 14A, 15A, 16A and 17A, respectively.
Figure 10C:
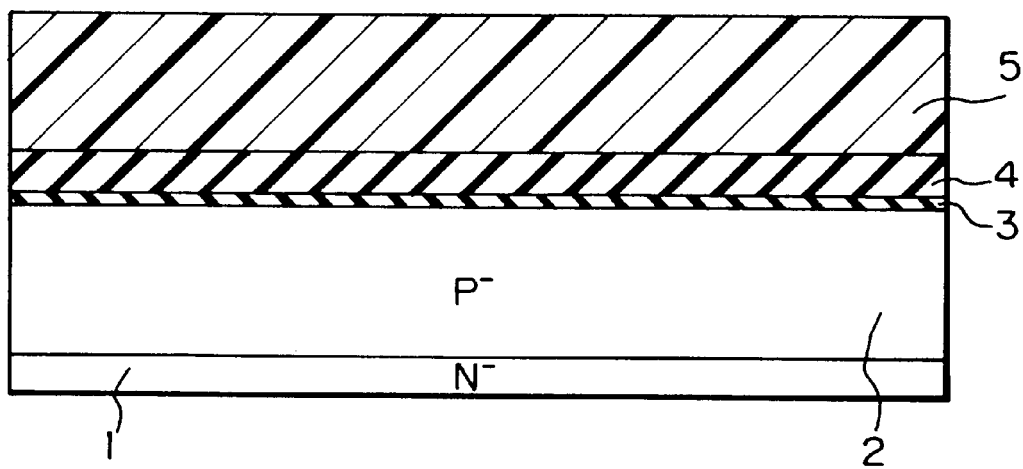
FIGS. 10C, 11C, 12C, 13C, 14C, 15C, 16C and 17C are cross-sectional views taken along the line C—C of FIGS. 10A, 11A, 12A, 13A, 14A, 15A, 16A and 17A, respectively.

First, referring to FIGS. 10A, 10B and 10C, in a similar way to that, of FIGS. 2A, 2B and 2C, a P−-type well 2 having an impurity concentration of about $10^{15}/cm^3$ is grown on an N−-type monocrystalline silicon substrate 1 having an impurity concentration of about $10^{15}/cm^3$. Then, the P−-type well 2 is thermally oxidized to form an about 5 to 20 nm thick silicon oxide layer 3, and thereafter, an about 50 to 300 nm thick silicon nitride layer 4 is deposited by a CVD process on the silicon oxide layer 3.

Then, a photoresist pattern 5 for defining an active area is formed, and the silicon nitride layer 4 is patterned by an anisotropic etching process using the photoresist pattern 5 as a mask.

Figure 11A:
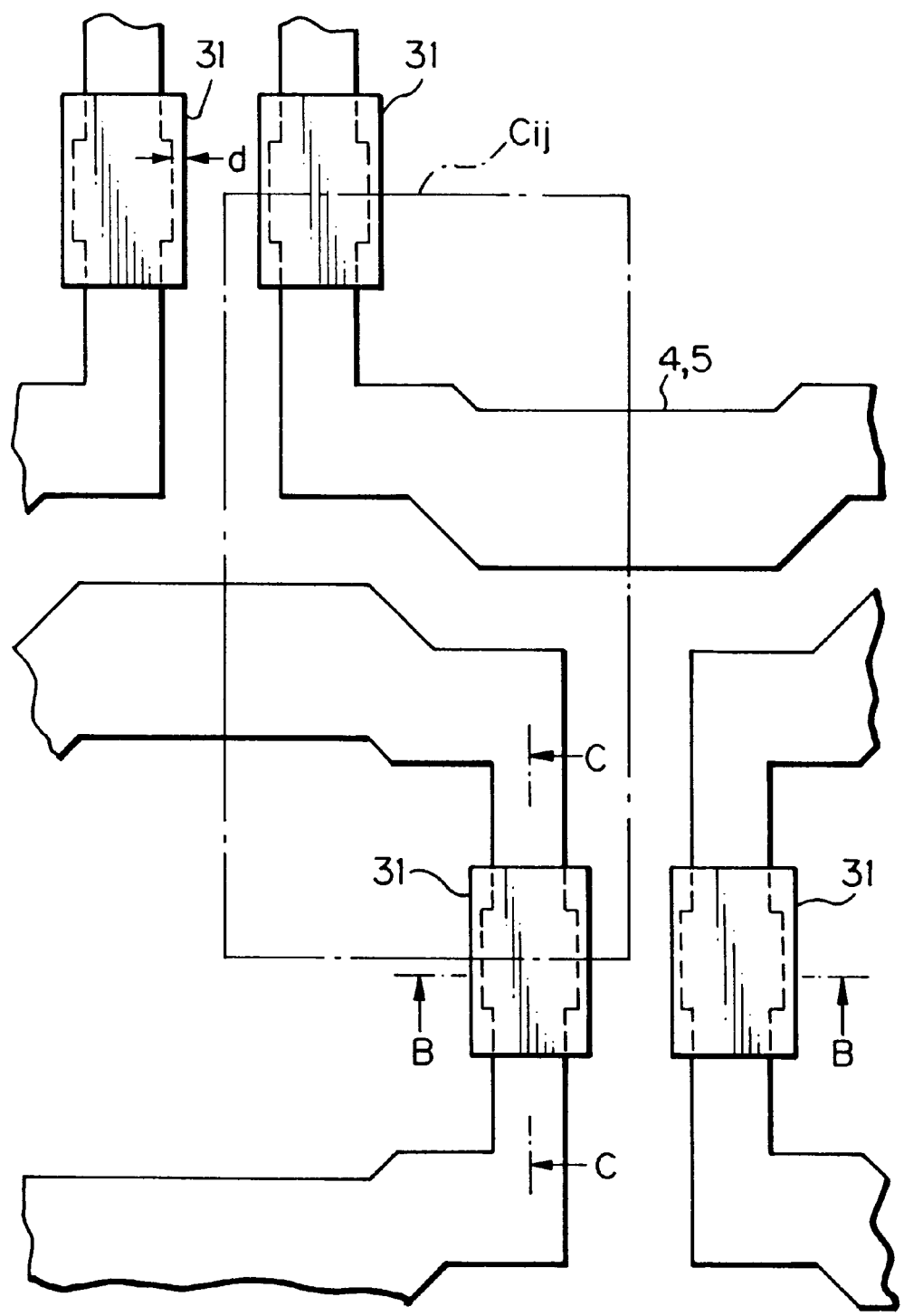
Figure 11B:
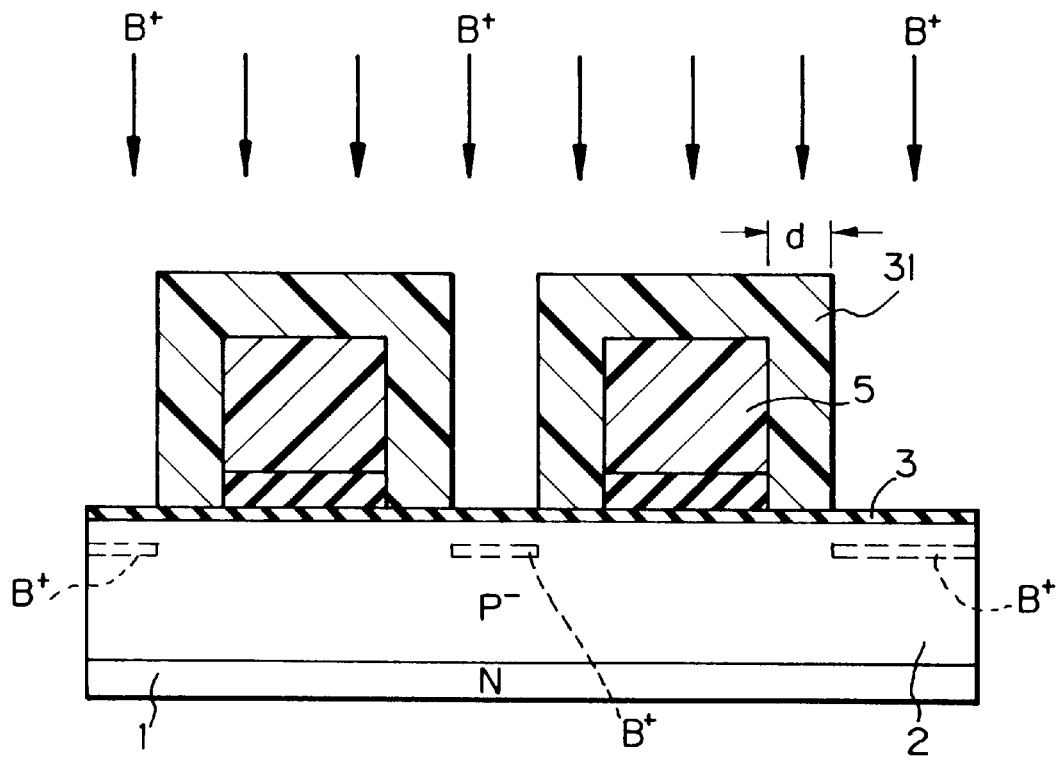
Figure 11C:
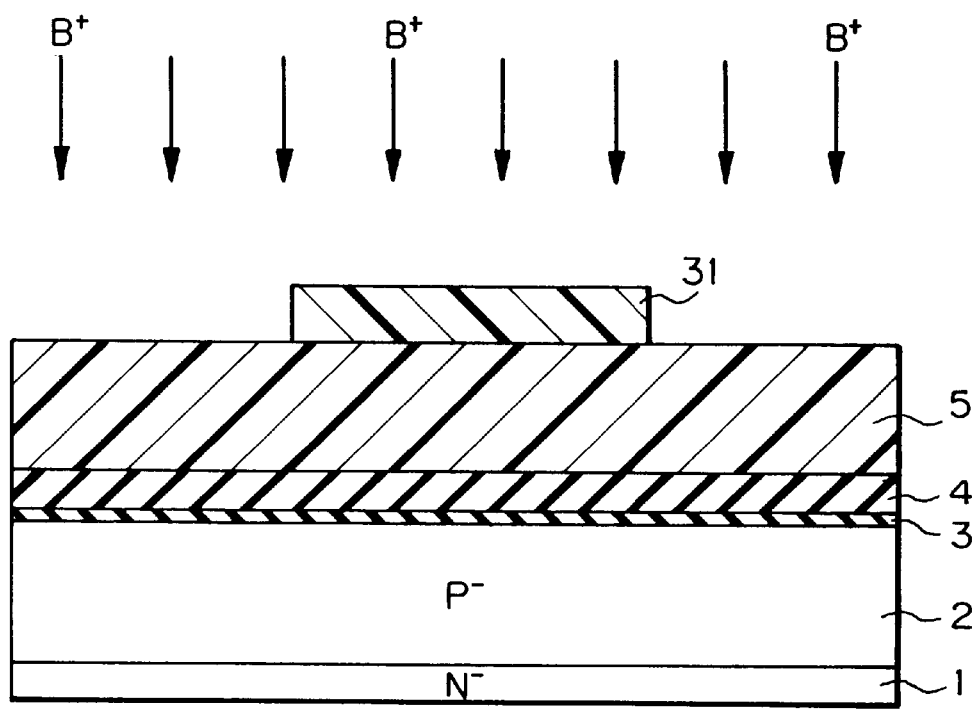

Next, referring to FIGS. 11A, 11B and 11C, an additional photoresist pattern 31 is formed to cover a part of the photoresist pattern 5. This part of the photoresist pattern 5 corresponds to a location where a contact plug will be formed. Then, boron ions are implanted into the P−-type well 2 by using the photoresist patterns 5 and 31 as a mask.

In FIGS. 11A, 11B and 11C, the thickness d of the photoresist pattern 31 is determined by $$d=t+\alpha$$

where t is a deviation of alignment of the contact plug; and

α is an amount determined by manufacturing processes such as a bird beak amount of the LOCOS process and traverse diffusion lengths of impurity diffusion regions. For example, if t=0.1 μm, then d=0.2 μm.

Note that; a peripheral circuit is usually formed by a CMOS circuit, and therefore, an N−-type well is also formed on the silicon substrate 1. In this case, the photoresist pattern 31 also covers the N−-type well. In this case, an additional process for forming the photoresist pattern 31 is unnecessary.

Then, the photoresist patterns 5 and 31 are removed.

Figure 12A:
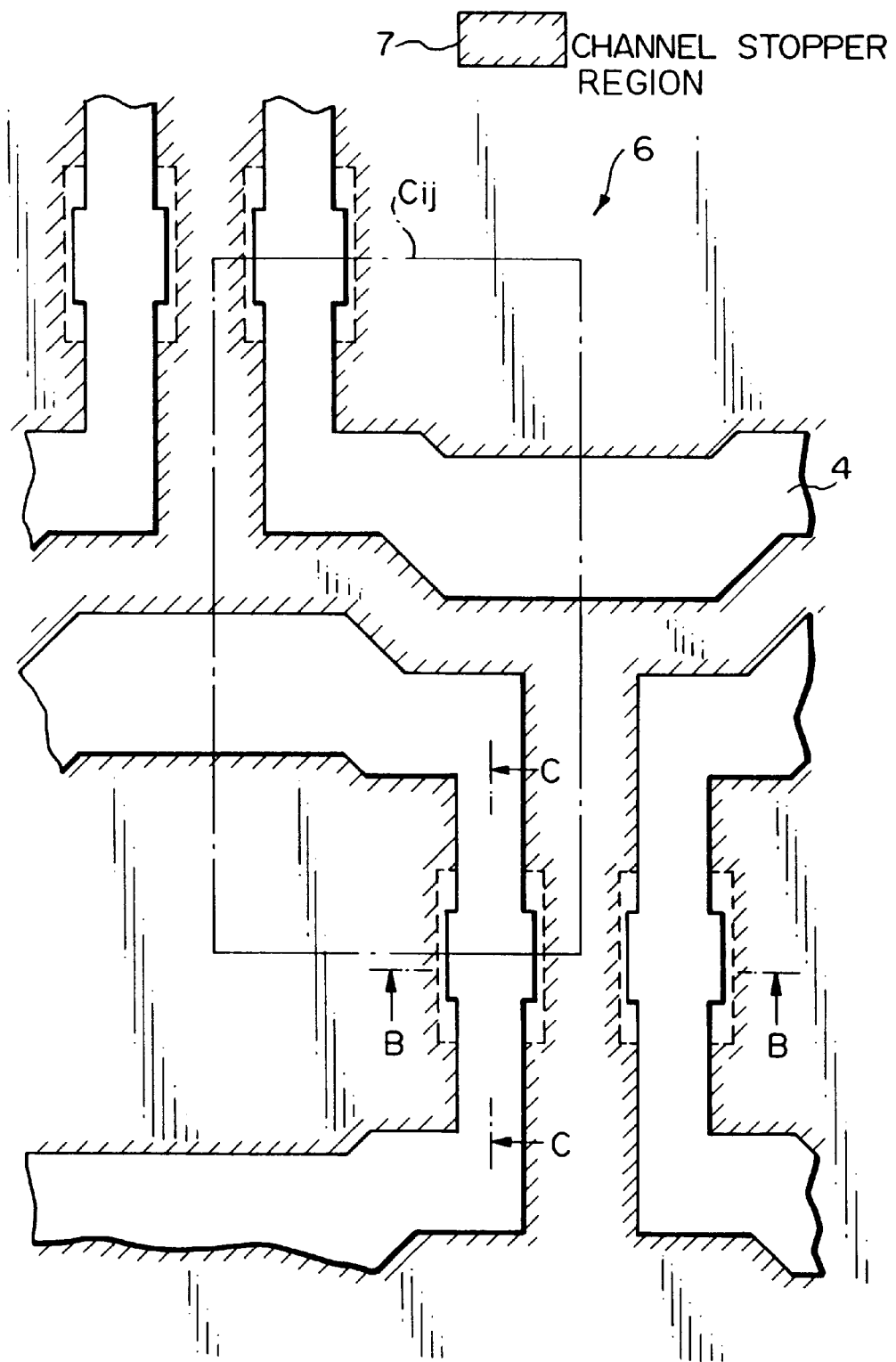
Figure 12B:
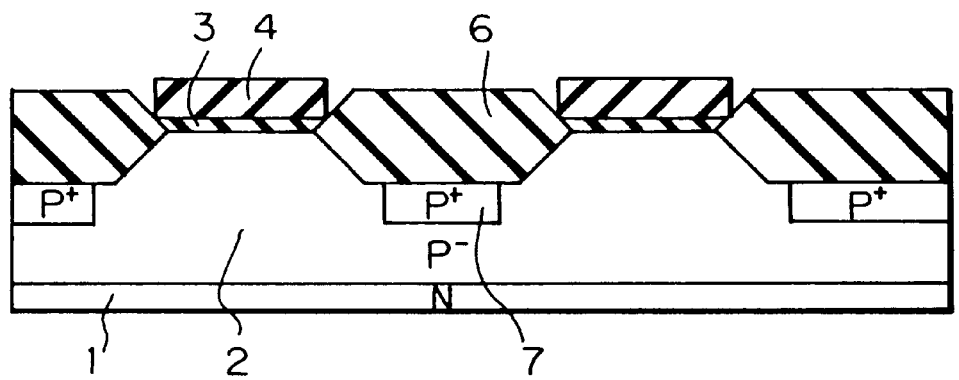
Figure 12C:
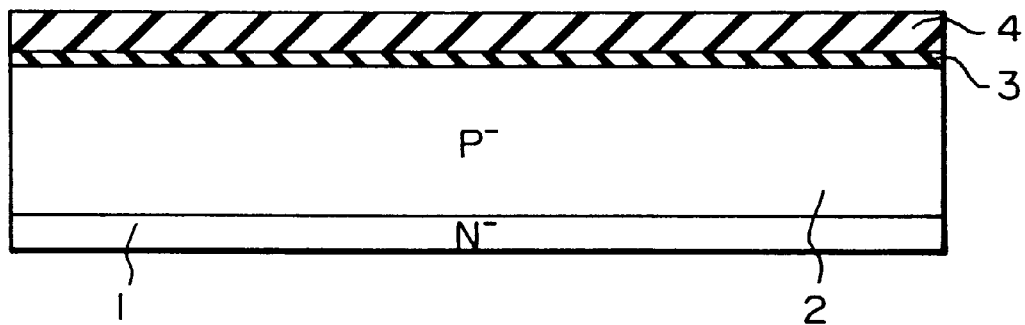

Next, referring to FIGS. 12A, 12B and 12C, in the same way as in FIGS. 3A, 3B and 3C, the P−-type well 2 is thermally oxidized by using the silicon nitride layer 4 as a mask, so that an about 200 to 500 nm thick field silicon oxide layer 6 is formed in a field area. This is called a LOCOS process. In this case, boron ions in the P−-type well 2 are simultaneously activated, so that a P+-type channel stopper region 7 is formed in self-alignment with the field silicon oxide layer 6. In this case, at locations where contact plugs will be formed, the area of the P+-type channel stopper region 7 is smaller than that of the field silicon oxide layer 6. Then, the silicon nitride layer 4 and the silicon oxide layer 3 are removed.

Figure 13A:
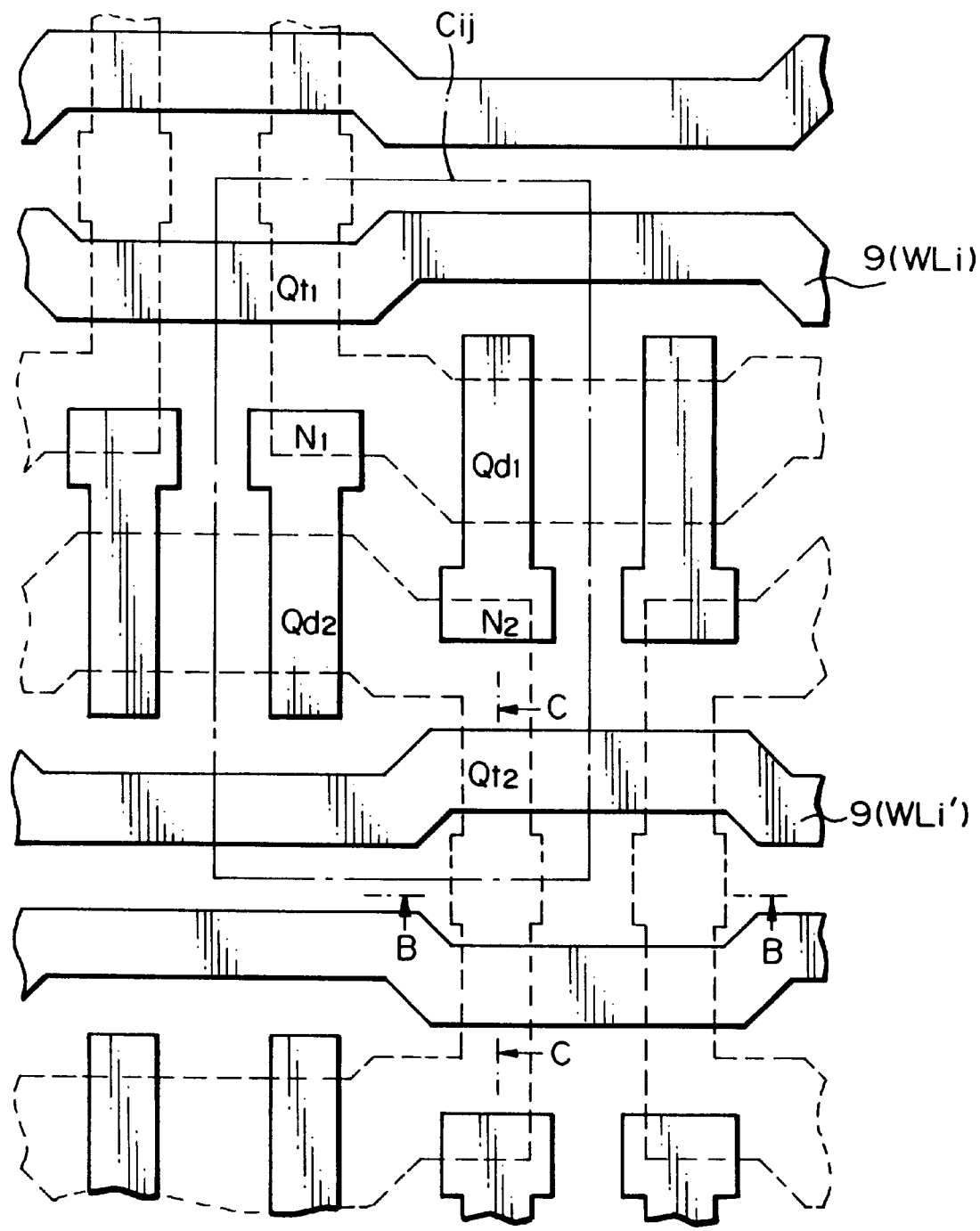
Figure 13B:
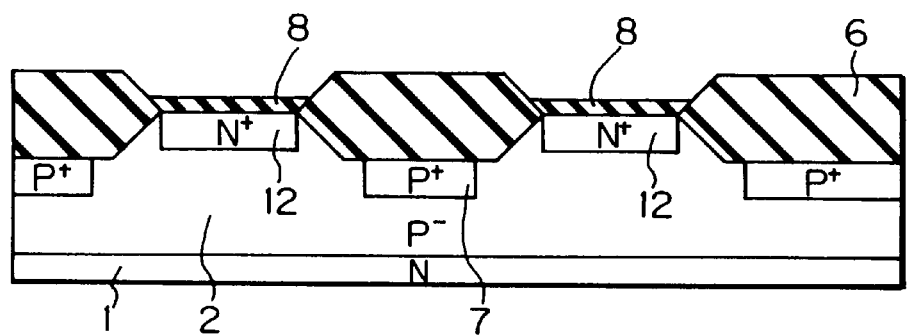
Figure 13C:
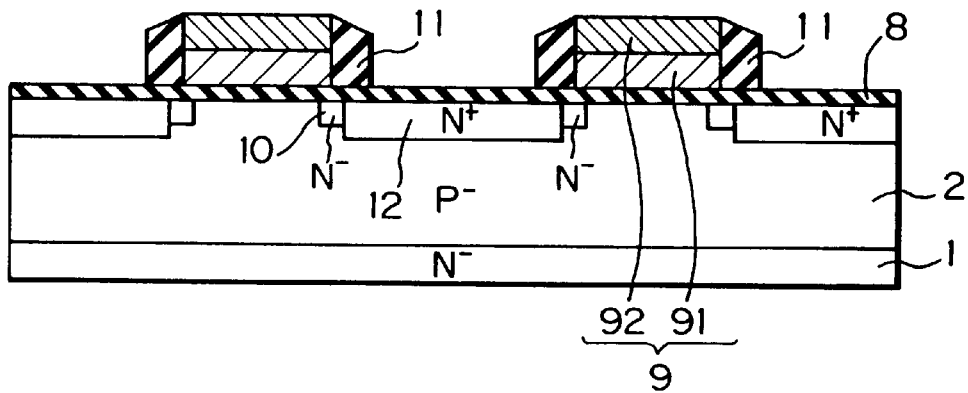

Next, referring to FIGS. 13A, 13B and 13C, in the same way as in FIGS. 4A, 4B and 4C, a gate silicon oxide layer 8 is formed by thermally oxidizing the $P^{31}$-type well 2. Then, a gate electrode layer 9 formed by a polycrystalline silicon layer 91 and a tungsten suicide layer 92 is formed on the gate silicon oxide layer 8 and the field silicon oxide layer 6. Note that the gate electrode layer 9 also forms word lines $WL_i$ and $WL_i'$. Then, phosphorous ions are implanted into the P−-type well 2 using the gate electrode layer 9 as a mask to form N−-type impurity diffusion regions 10 of an LDD configuration. Then, a silicon oxide layer is formed on the entire surface, and an isotropic etching operation is performed upon the silicon oxide layer to form sidewall silicon oxide layers 11. Then, arsenic ions are implanted into the substrate 1 using the sidewall silicon oxide layers 6 as a mask to form N+-type impurity diffusion regions 12 of the LDD configuration.

Figure 14A:
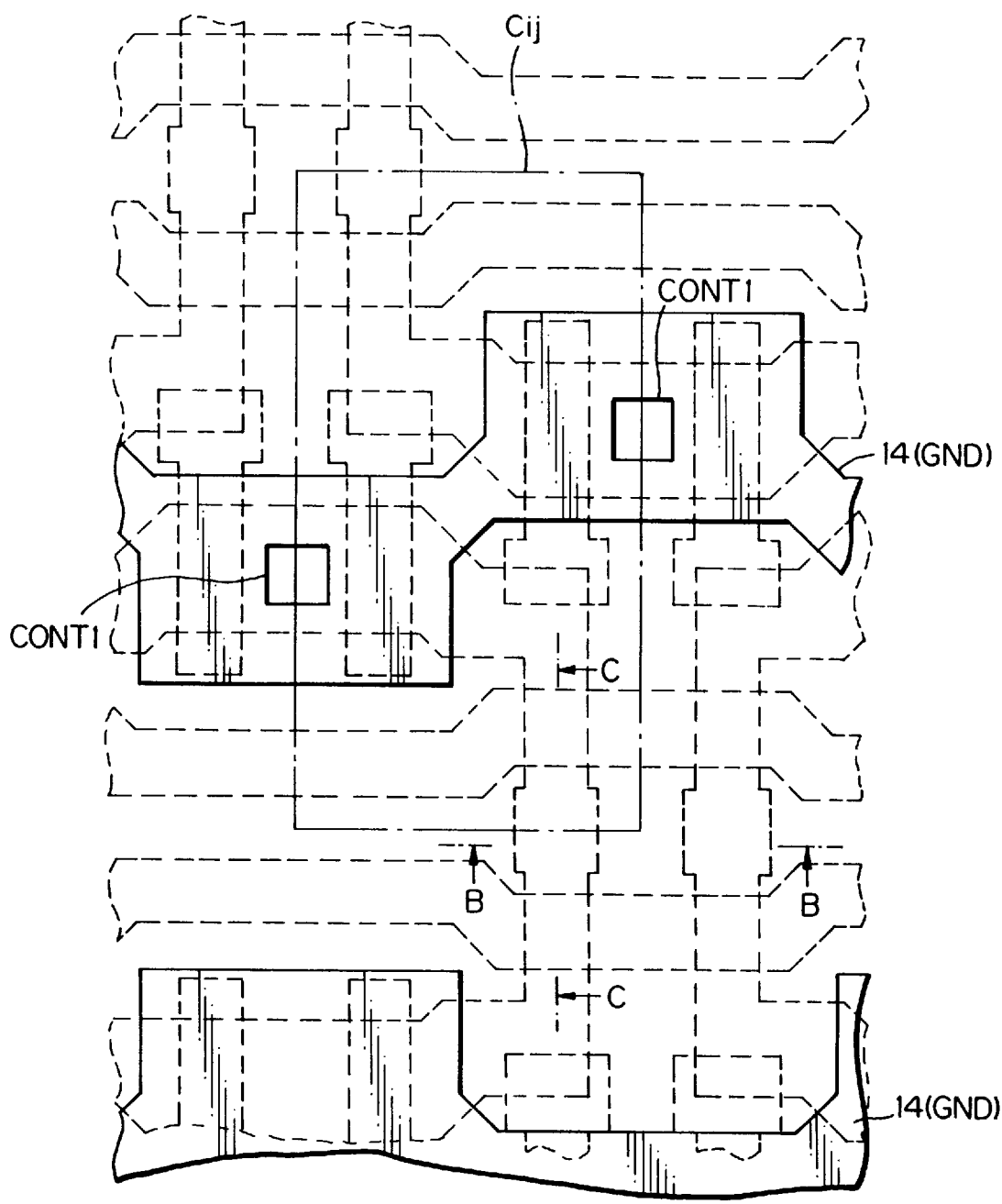
Figure 14B:
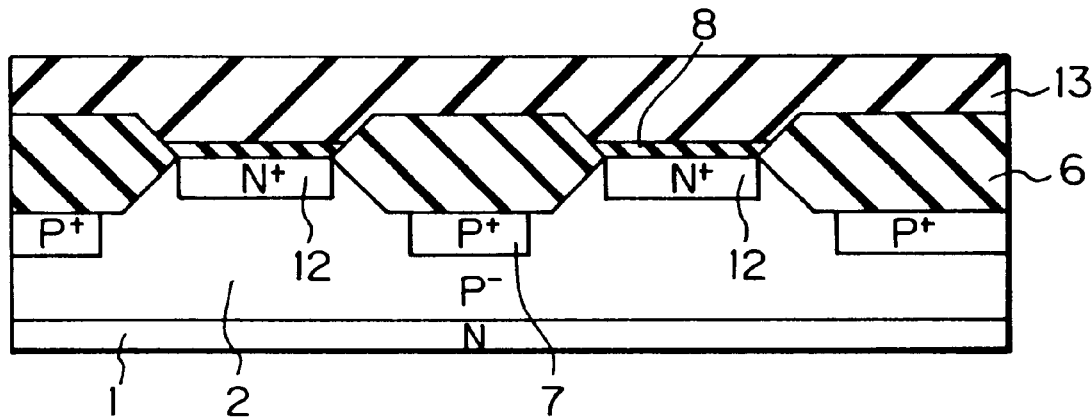
Figure 14C:
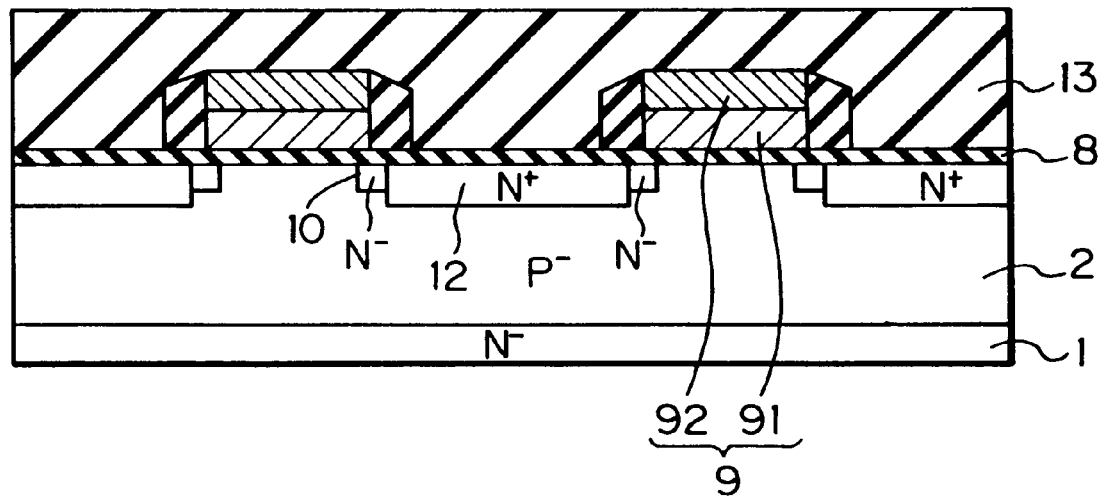

Next, referring to FIGS. 14A, 14B and 14C, in the same way as in FIGS. 5A, 5B and 5C, a silicon oxide layer 13 is deposited on the entire surface by a CVD process, and contact holes CONT1 are perforated in the silicon oxide layer 13. Then, a tungsten silicide layer 14 is formed on the silicon oxide layer 13 by a sputtering process, and is patterned to form a ground line GND. In this case, the ground line GND is connected via the contact holes CONT1 to the sources (the N+-type impurity regions 12) of the drive transistors $Q_{di}$ and $Q_{d2}$.

Figure 15A:
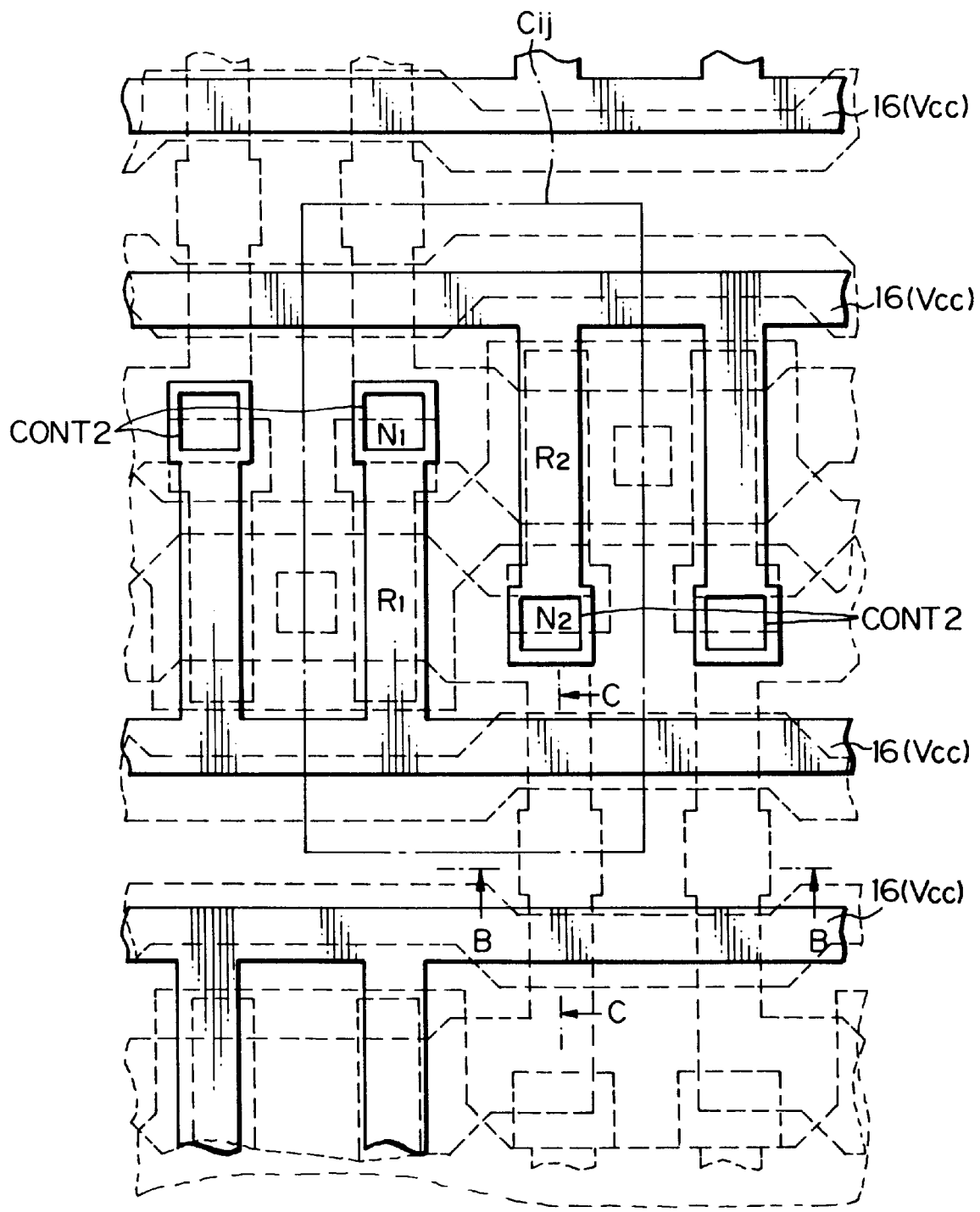
Figure 15B:
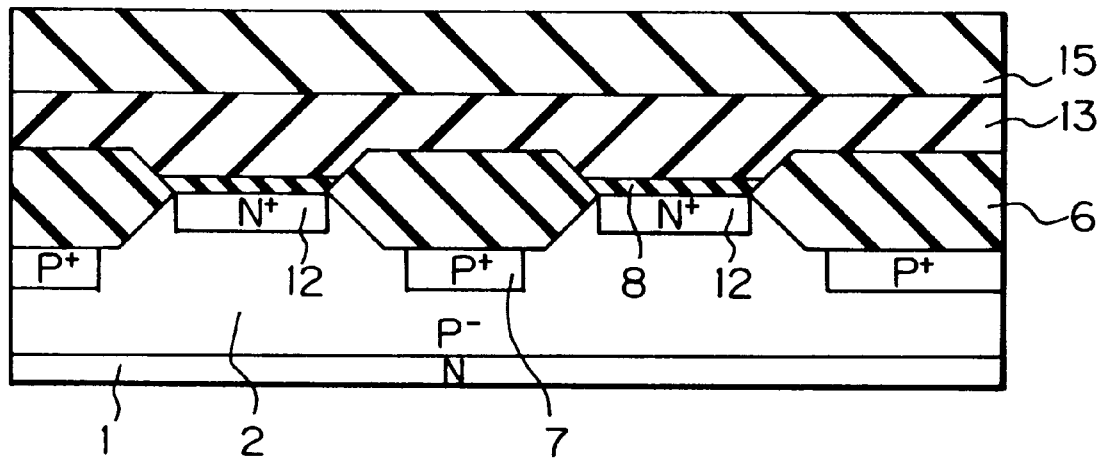
Figure 15C:
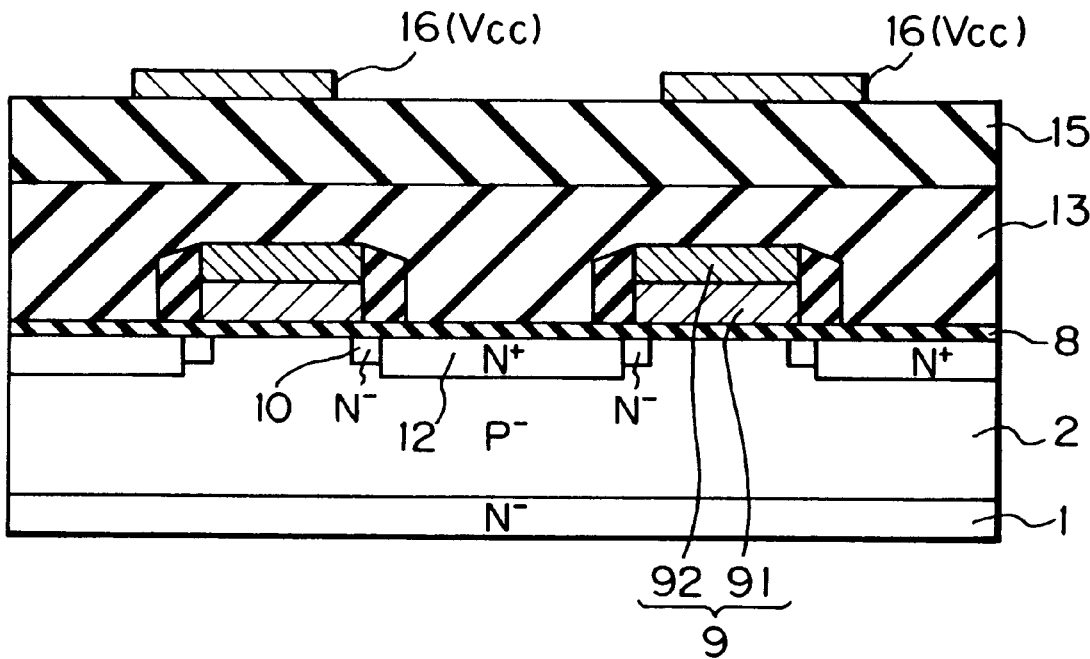

Next, referring to FIGS. 15A, 15B and 15C, in the same way as in FIGS. 6A, 6B and 6C, a silicon oxide layer 15 is deposited on the entire surface by a CVD process, and contact holes CONT2 are perforated in the silicon oxide layers 15 and 13. Then, a polycrystalline silicon layer 16 is formed on the silicon oxide layer 15 by a CVD process, and is patterned to form a power supply line $V_{cc}$ and load resistors $R_1$ and $R_2$. In this case, the load resistors $R_1$ and $R_2$ are connected via the contact holes CONT2 to the nodes $N_1$ and $N_2$ as well as the gates of the drive transistors $Q_{d2}$ and $Q_{d1}$.

Figure 16A:
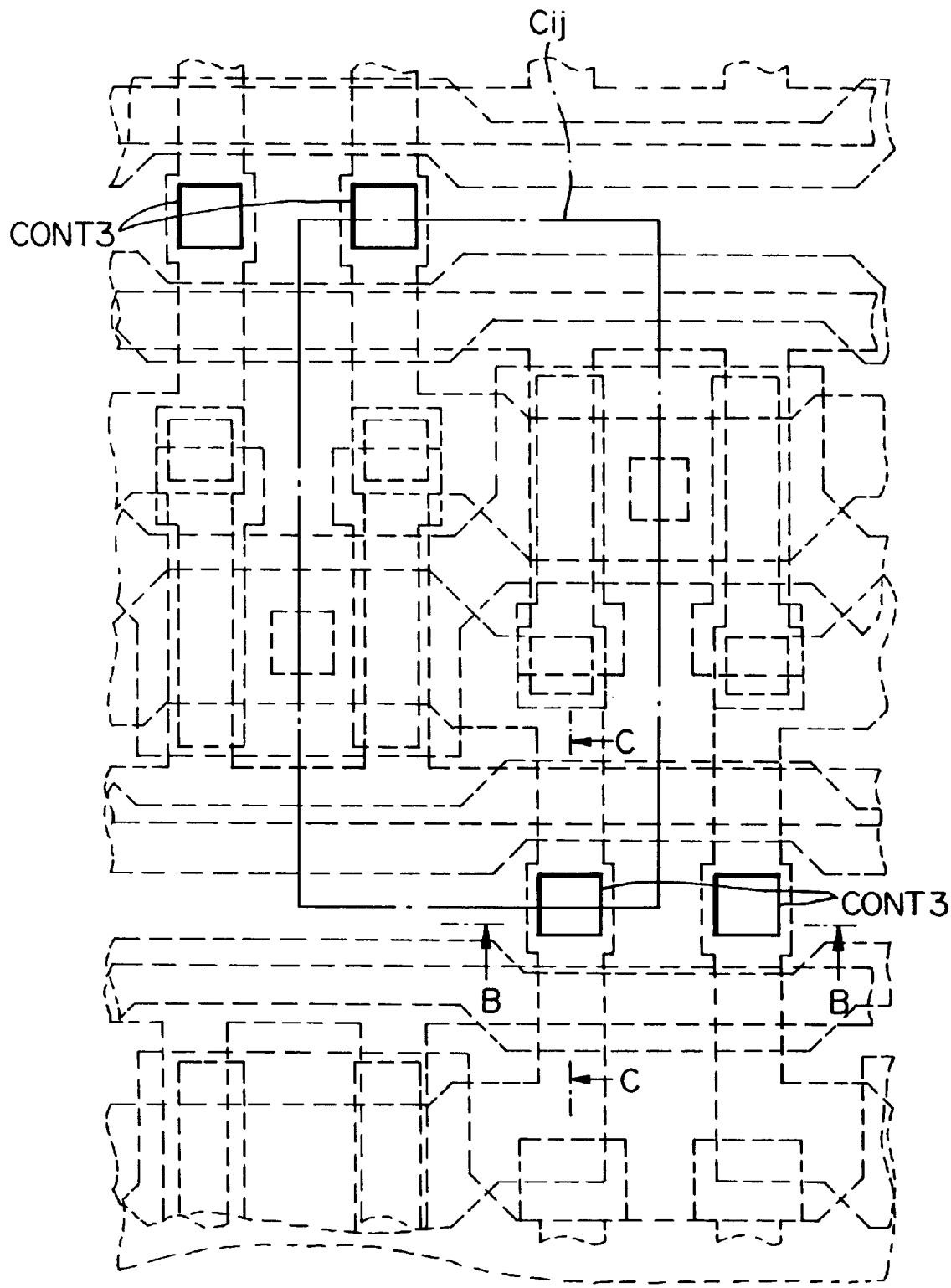
Figure 16B:
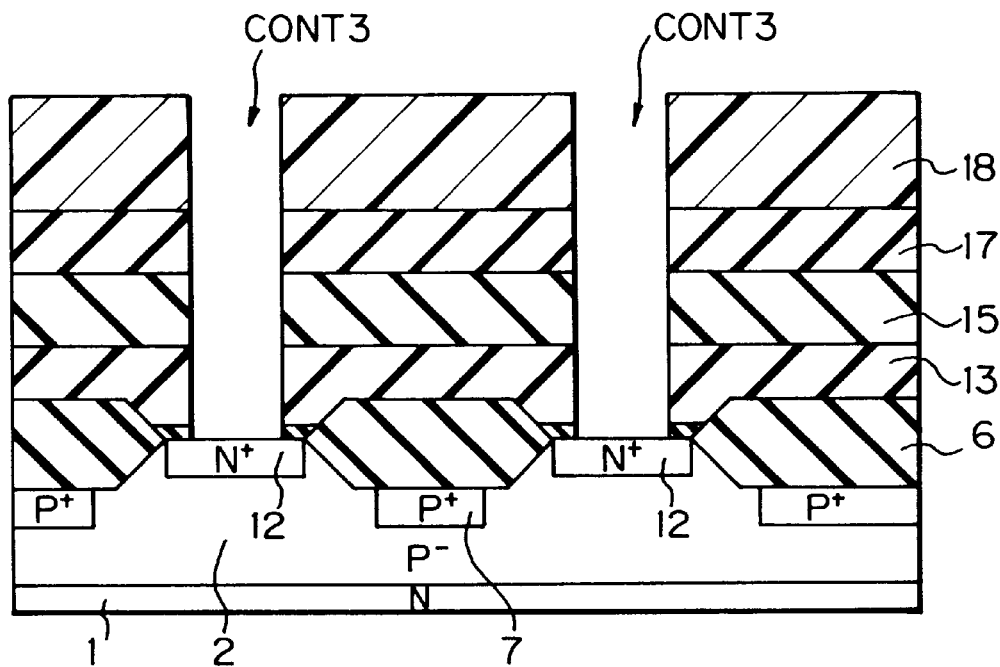
Figure 16C:
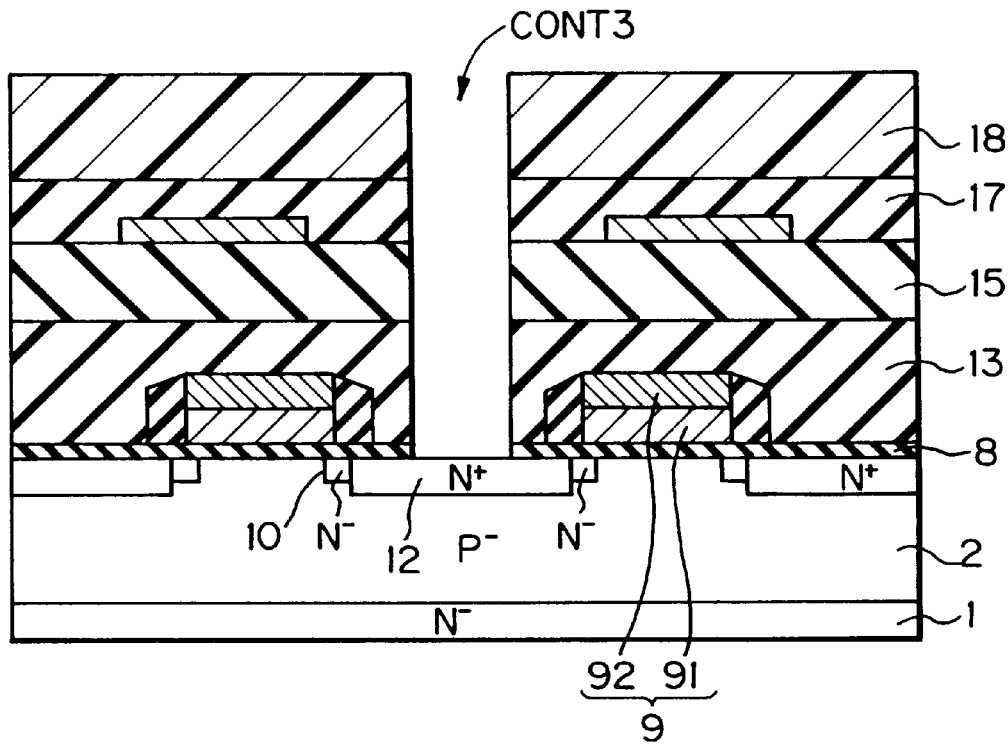

Next, referring to FIGS. 16A, 16B and 16C, in the same way as in FIGS. 7A, 7B and 7C, a silicon oxide layer 17 is deposited on the entire surface by a CVD process. Then, a photoresist pattern 17 is formed and the silicon oxide layers 17, 15, 13 and 8 are anisotropically etched by using the photoresist pattern 18 as a mask to form contact holes CONT3. Then, the photoresist pattern 18 is removed.

Next, referring to FIGS. 16A, 16B and 16C, in the same way as in FIGS. 7A, 7B and 7C, phosphorous ions are implanted into the P−-type well 2 by the silicon oxide layers 17, 15, 13 and 8 as a mask and the device is annealed, so that an N+-type impurity diffusion region 19 is formed. Then, a tungsten layer is formed by a sputtering process, and the tungsten layer is etched back by an anistropic etching process, so that tungsten plugs 20 are buried in the contact holes CONT3.

Figure 17A:
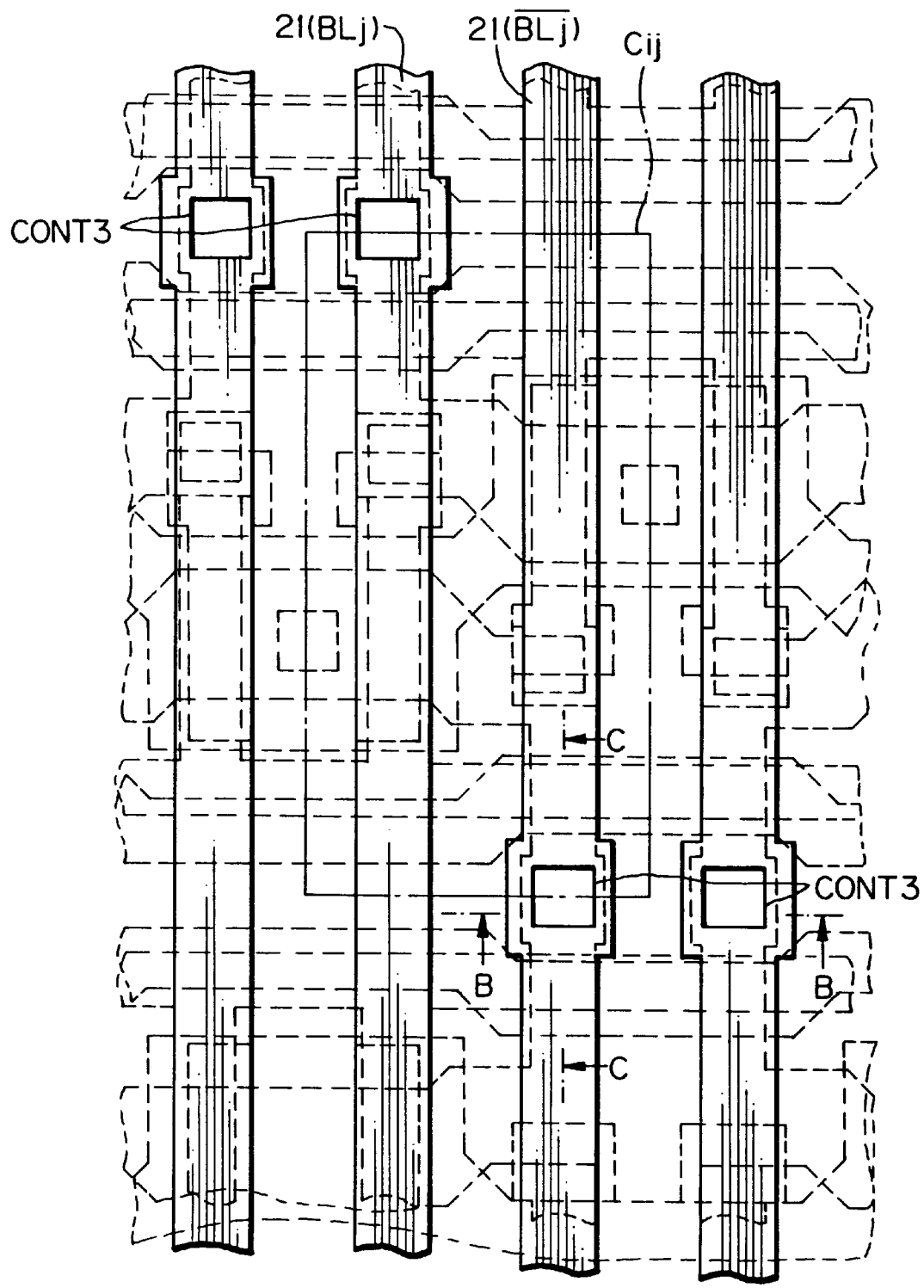
Figure 17B:
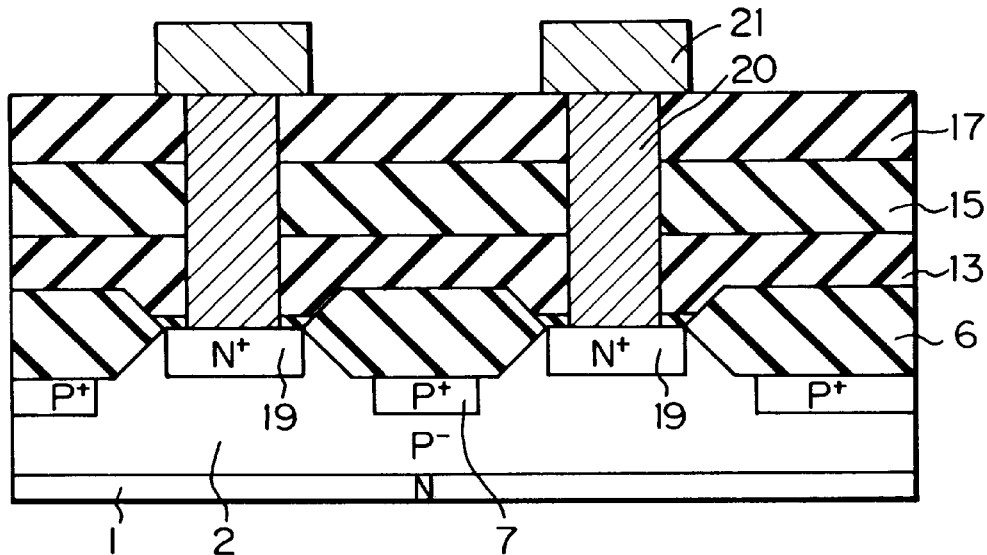
Figure 17C:
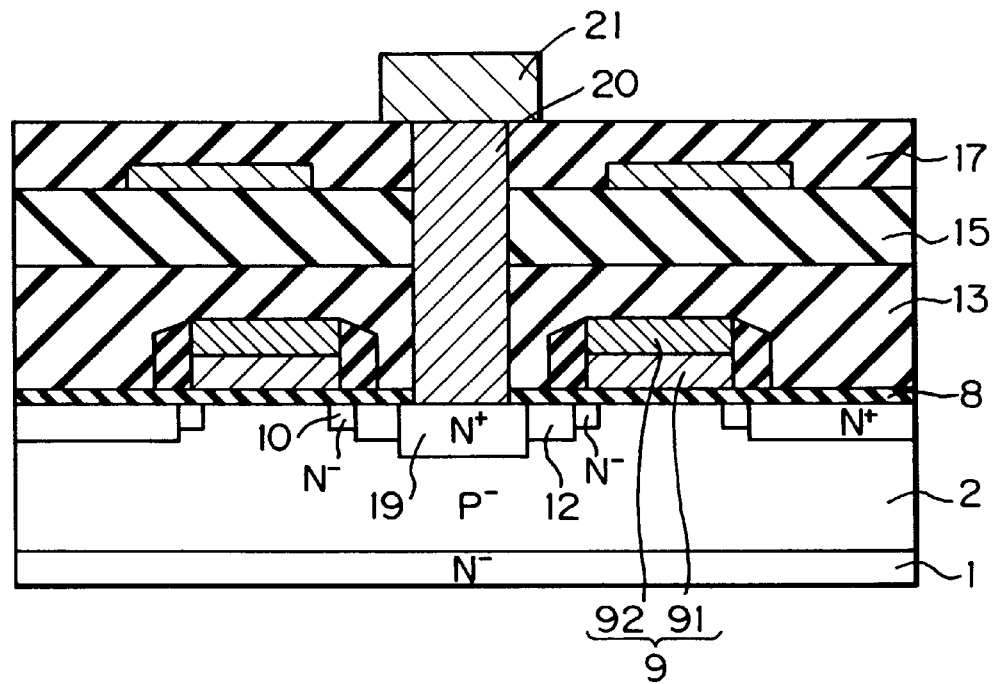

Finally, referring to FIGS. 17A, 17B and 17C, in the same way as in FIGS. 8A, 8B and 8C, an aluminum layer 21 is deposited on the entire surface by a sputtering process, and the aluminum layer 21 is patterned to form bit lines $\overline{BL_j}$ and $BL_j$.

Figure 18:
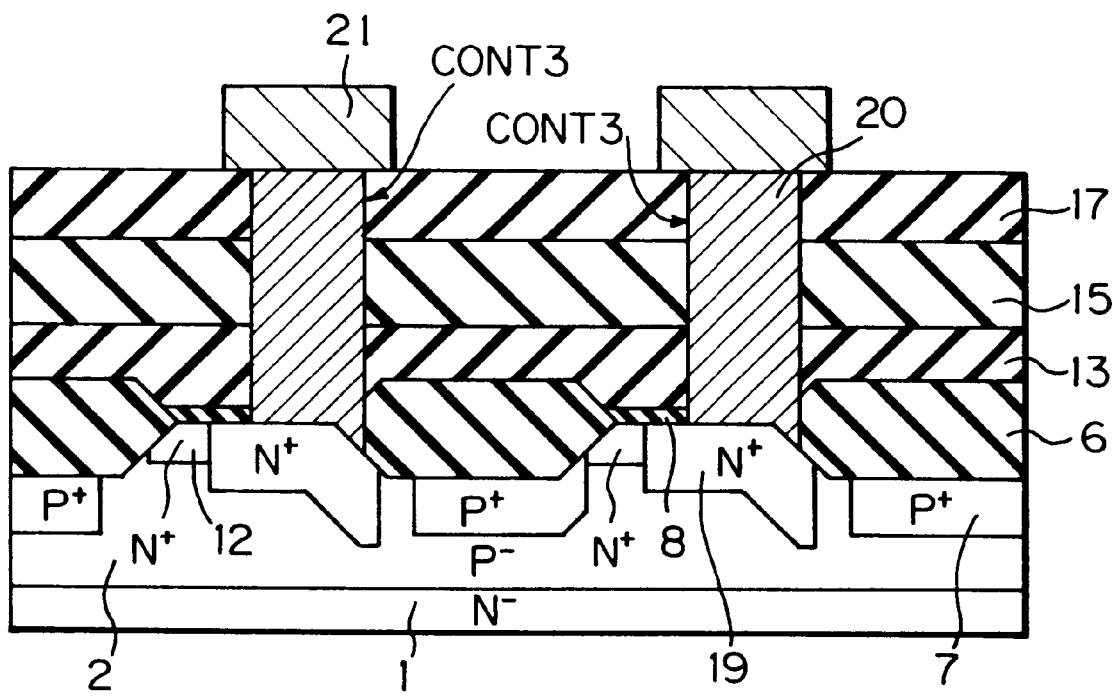
FIG. 18 is a cross-sectional view illustrating a modification of FIG. 17B.

In FIGS. 17A, 17B and 17C, in the same way as in FIGS. 8A, 8B and 8C, the N$^+$-type impurity diffusion region 19 prevents the tungsten plugs 20 from being short-circuited to the P$^+$-type channel stopper region 7. For example, as illustrated in FIG. 18, which is a modification of FIG. 17B, even if the contact holes CONT3 are shifted from optimum locations, the N$^+$-type impurity diffusion region 19 is always formed in self-alignment with the tungsten plug 20. Therefore, the tungsten plugs 20 are never directly connected to the P$^+$-type channel stopper region 7.

In addition, since the N$^+$-type impurity diffusion region 19 is apart from the P$^+$-type channel stopper region 7, a capacitance caused by a PN junction formed by the low impurity concentration P$^-$-type well 2 and the high impurity concentration N$^+$-type impurity diffusion region 19 is remarkably decreased. This decreases the parasitic capacitance of the aluminum layer 21 connected to this PN junction, thus increasing the operation of the device.

FIGS. 19A, 20A, 21A, 22A, 23A, 24A, 25A and 26A are plan views for explaining a second embodiment of the method for manufacturing a SRAM device according to the present invention, FIGS. 19B, 20B, 21B, 22B, 23B, 24B, 25B and 26B are cross-sectional views taken along the line B—B of FIGS. 19A, 20A, 21A, 22A, 23A, 24A, 25A and 26A, respectively, and FIGS. 19c, 20C, 21C, 22C, 23C, 24C, 25C and 26C are cross-sectional views taken along the line C—C of FIGS. 19A, 20A, 21A, 22A, 23A, 24A, 25A and 26A, respectively.

Figure 19A:
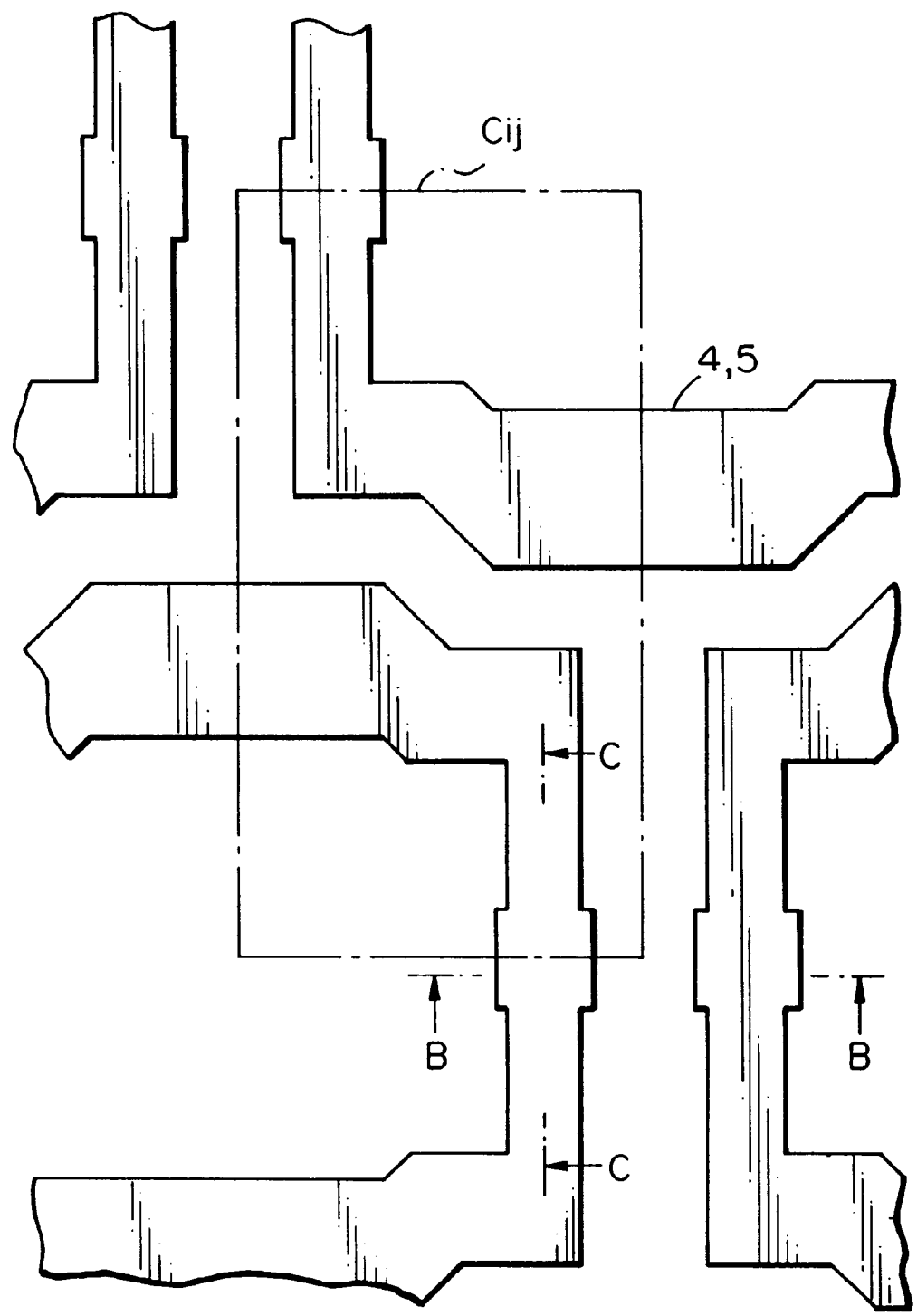
FIGS. 19A, 20A, 21A, 22A, 23A, 24A, 25A and 26A are plan views for explaining a second embodiment of the method for manufacturing an SRAM device according to the present invention.
Figure 19B:
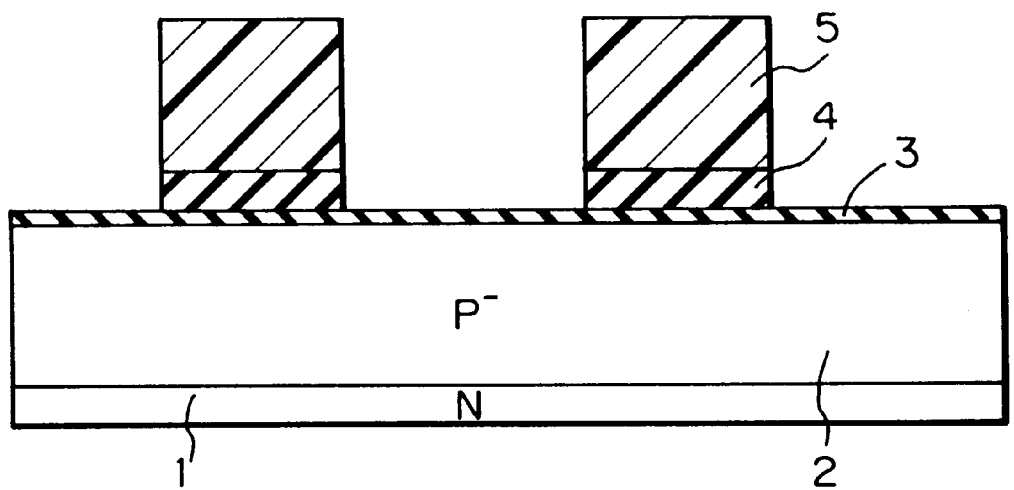
FIGS. 19B, 20B, 21B, 22B, 23B, 24B, 25B and 26B are cross-sectional views taken along the line B—B of FIGS. 19A, 20A, 21A, 22A, 23A, 24A, 25A and 26A respectively.
Figure 19C:
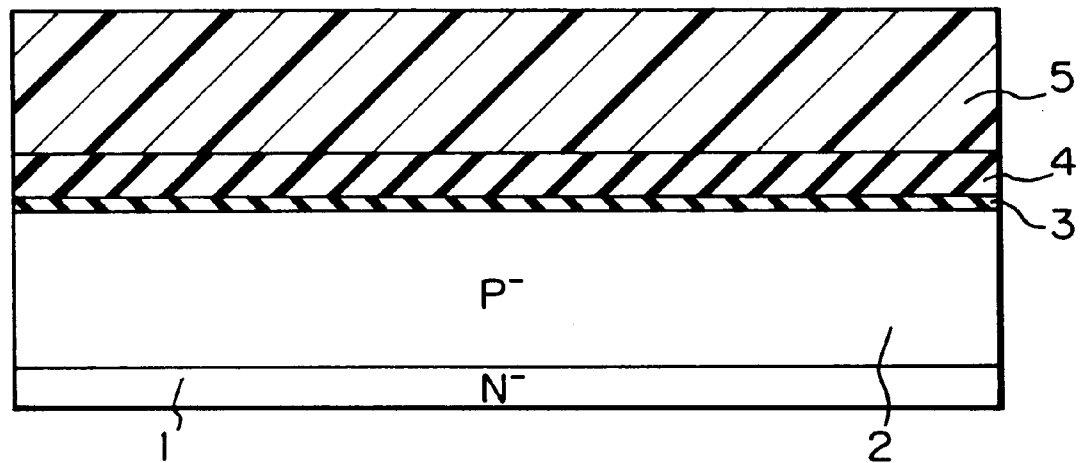
FIGS. 19C, 20C, 21C, 22C, 23C, 24C, 25C and 26C are cross-sectional views taken along the line C—C of FIGS. 19A, 20A, 21A, 22A, 23A, 24A, 25A and 26A respectively.

First, referring to FIGS. 19A, 19B and 19C, in a similar way to that of FIGS. 10A, 10B and 10C, a P$^-$-type well 2 having an impurity concentration of about $10^{15}$/cm$^3$ is grown on an N$^-$-type monocrystalline silicon substrate 1 having an impurity concentration of about $10^{15}$/cm$^3$. Then, the P$^-$-type well 2 is thermally oxidized to form an about 5 to 20 nm thick silicon oxide layer 3, and thereafter, an about 50 to 300 nm thick silicon nitride layer 4 is deposited by a CVD process on the silicon oxide layer 3.

Then, a photoresist pattern 5 for defining an active area is formed, and the silicon nitride layer 4 is patterned by an anisotropic etching process using the photoresist pattern 5 as a mask.

Then, the photoresist pattern 5 is removed.

Figure 20A:
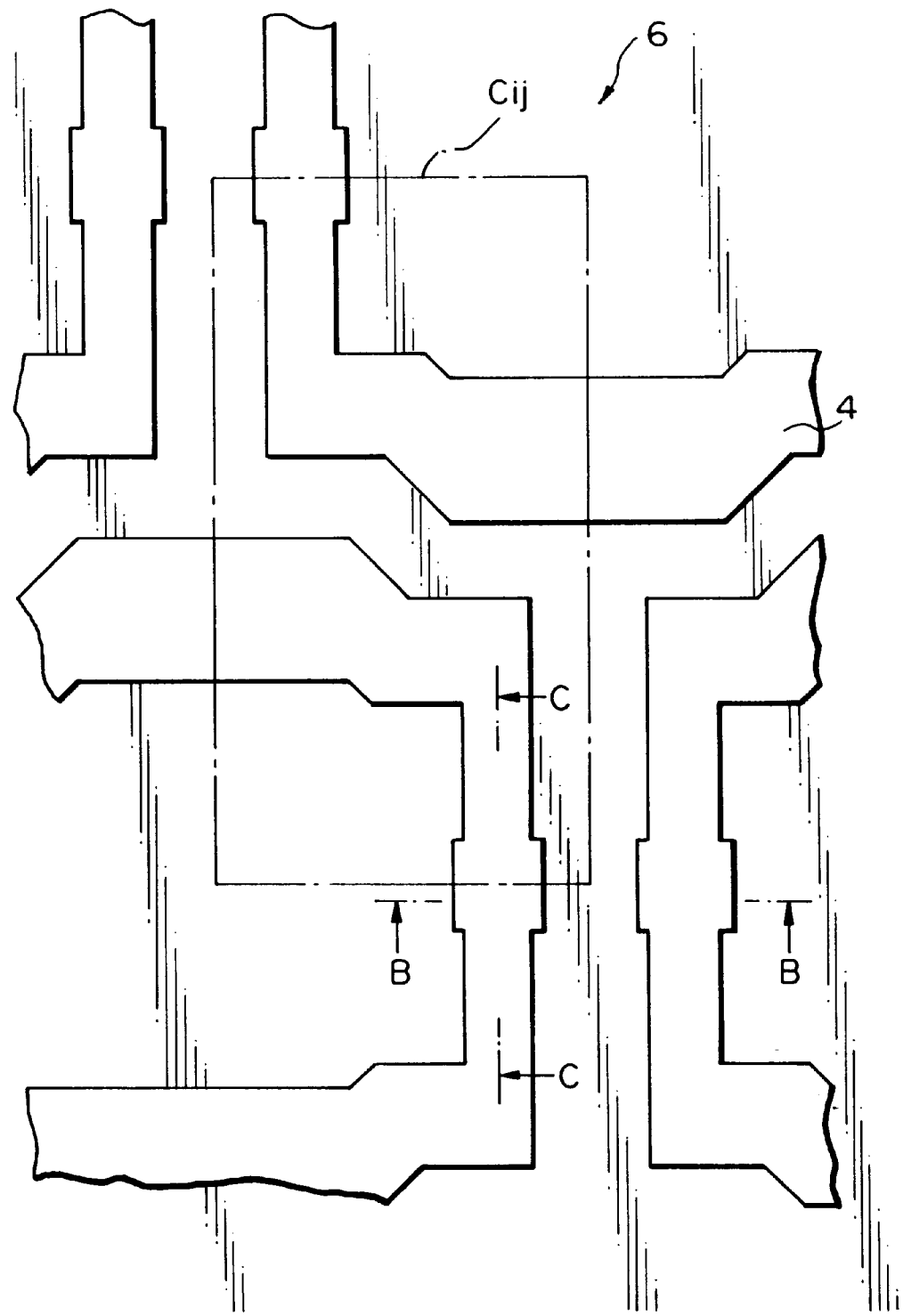
Figure 20B:
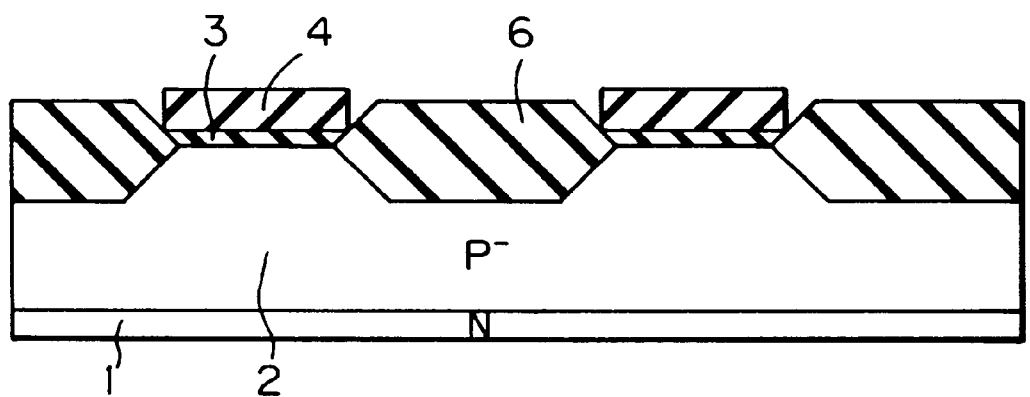
Figure 20C:
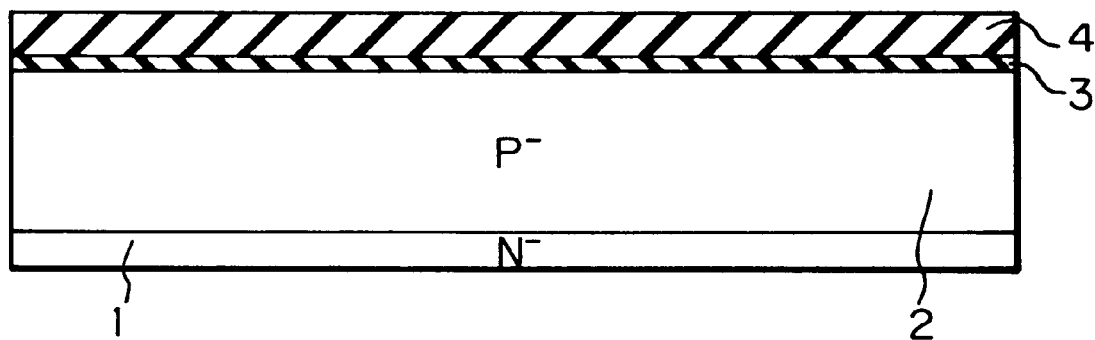

Next, referring to FIGS. 20A, 20B and 20C, in the same way as in FIGS. 12A, 12B and 12C, the P$^-$-type well 2 is thermally oxidized by using the silicon nitride layer 4 as a mask, so that an about 200 to 500 nm thick field silicon oxide layer 6 is formed in a field area. This is called a LOCOS process. Then, the silicon nitride layer 4 is removed.

Figure 21A:
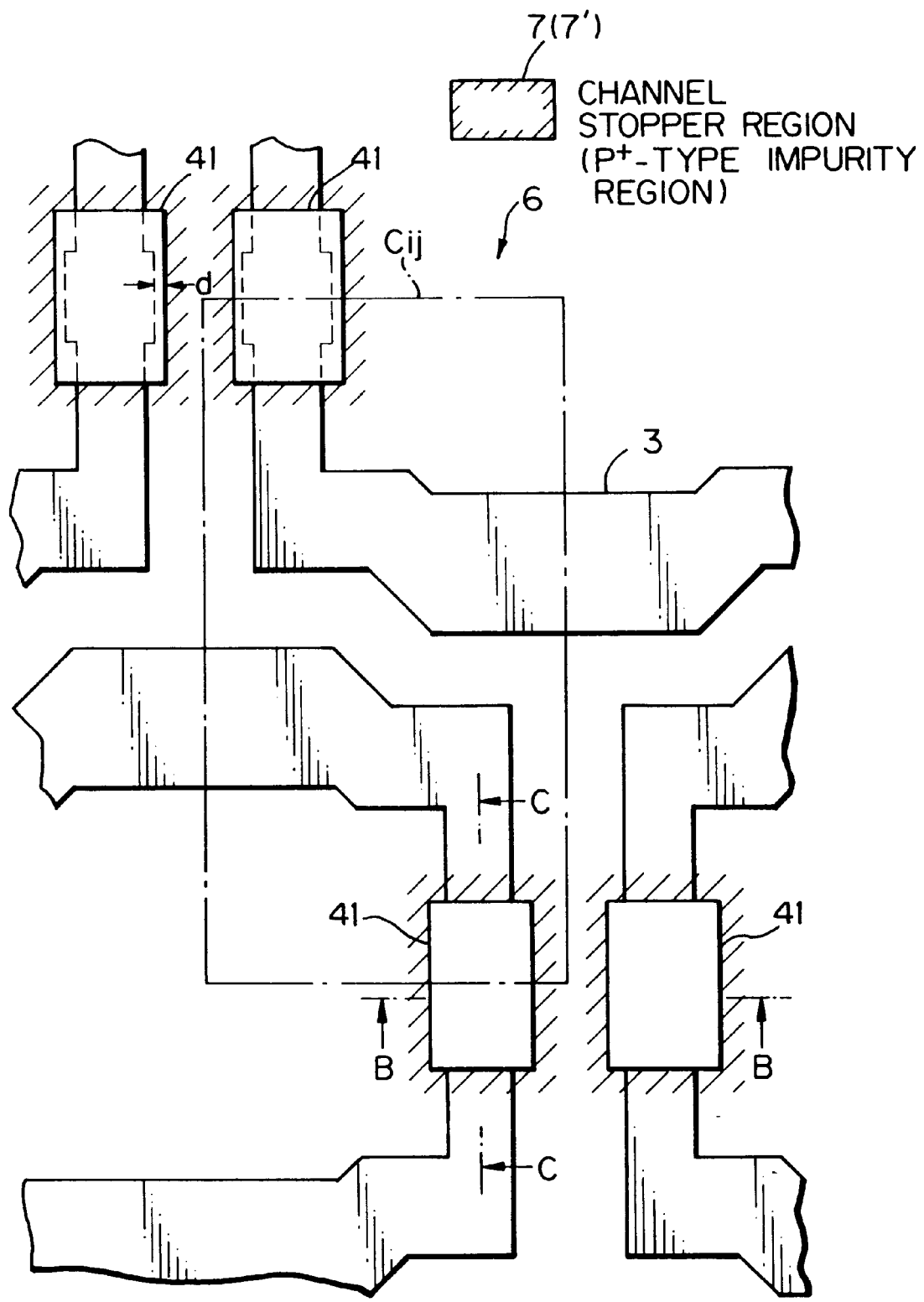
Figure 21B:
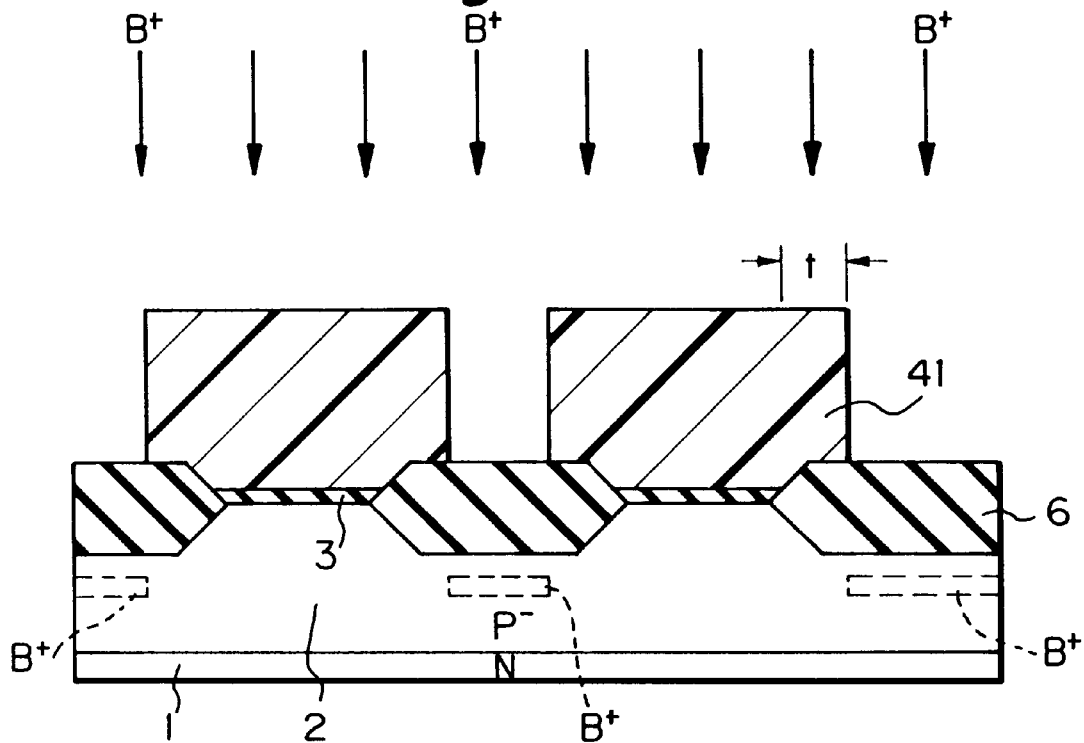
Figure 21C:
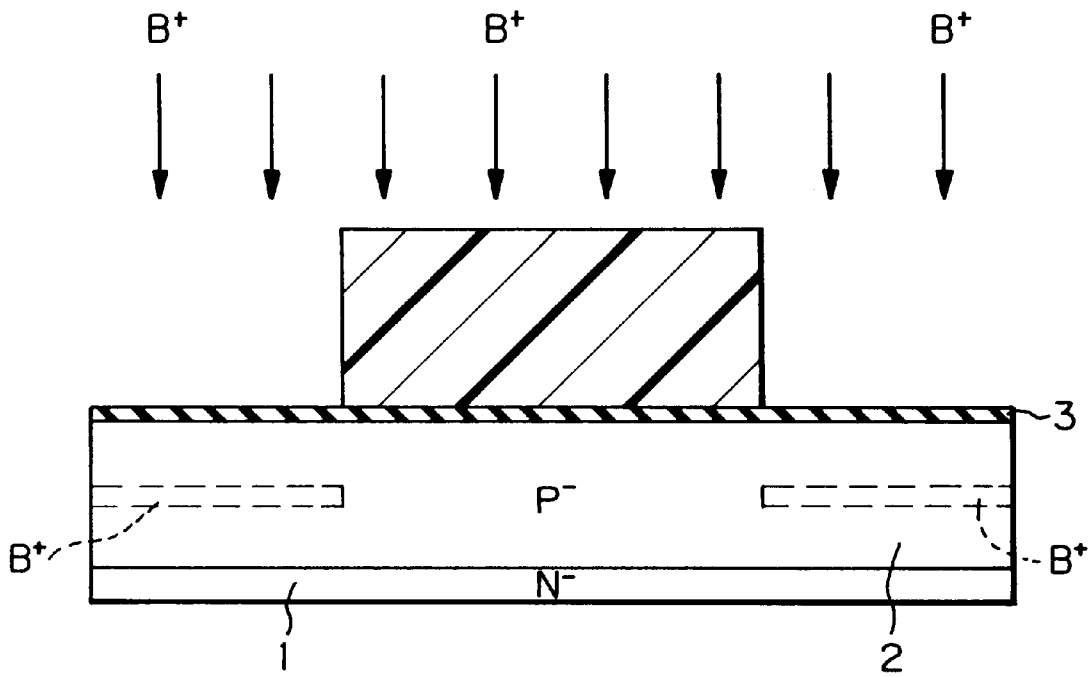

Next, referring to FIGS. 21A, 21B and 21C, in a similar way to that of FIGS. 11A, 11B and 11C, a photoresist pattern 41 is formed to cover only a location where a contact plug will be formed. Then, boron ions are implanted into the P$^-$-type well 2 by using the photoresist pattern 41 as a mask.

In FIGS. 21A, 21B and 21C, the difference d in width between the photoresist pattern 41 and the silicon oxide layer 3 in the above-mentioned part is determined by $$d = t + \alpha$$

where t is a deviation of alignment of the contact plug; and

α is an amount determined by manufacturing processes such as a bird beak amount of the LOCOS process and traverse diffusion lengths of impurity diffusion regions. For example, if t=0.1 μm, d=0.2 μm.

Note that a peripheral circuit is usually formed by a CMOS circuit, and therefore, an N$^-$-type well is also formed on the silicon substrate 1. In this case, the photoresist pattern 41 also covers the N$^-$-type well. In this case, an additional process for forming the photoresist pattern 41 is unnecessary. Then, the photoresist pattern is removed. Then, an annealing operation is carried out so that boron ions in the P$^-$-type well 2 are activated. Thus, a P$^-$-type channel stopper region 7 (see FIG. 22B) is formed in self-alignment with the field silicon oxide layer 6, and simultaneously, a P$^+$-type impurity diffusion region 7' (see FIG. 22C) is formed at the nodes $N_1$, and $N_2$. In this case, at locations where contact plugs will be formed, the area of the P$^-$-type channel stopper region 7 is smaller than that of the field silicon oxide layer 6. On the other hand, the N$^+$-type impurity diffusion region 7' forms a PN junction with the N$^+$-type impurity diffusion region 12, and therefore, a large capacitance caused by this PN junction enables a stable operation without being subjected to external noise. Then, the silicon oxide layer 3 is removed.

Figure 22A:
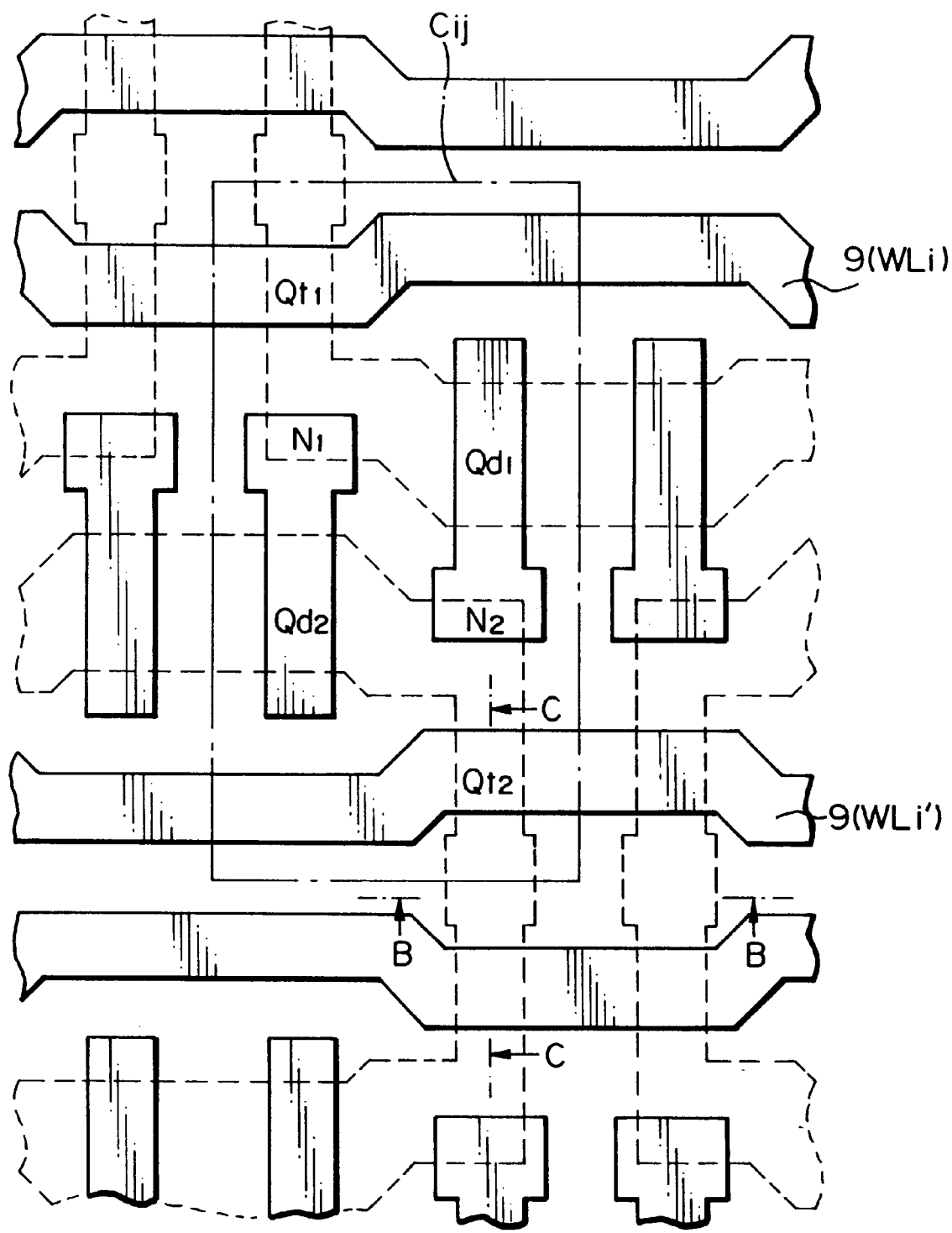
Figure 22B:
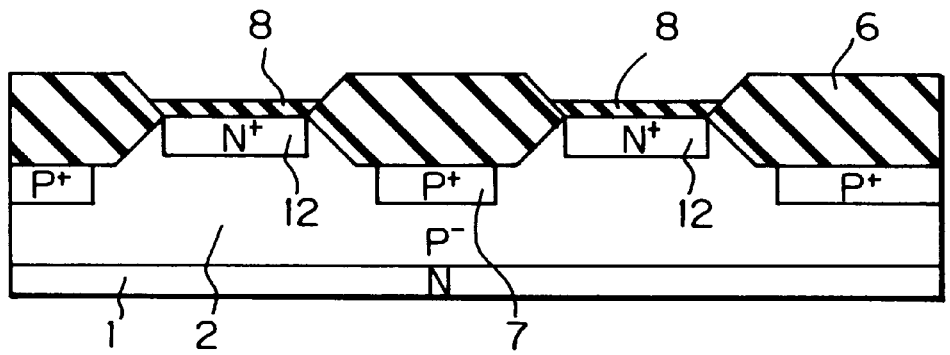
Figure 22C:
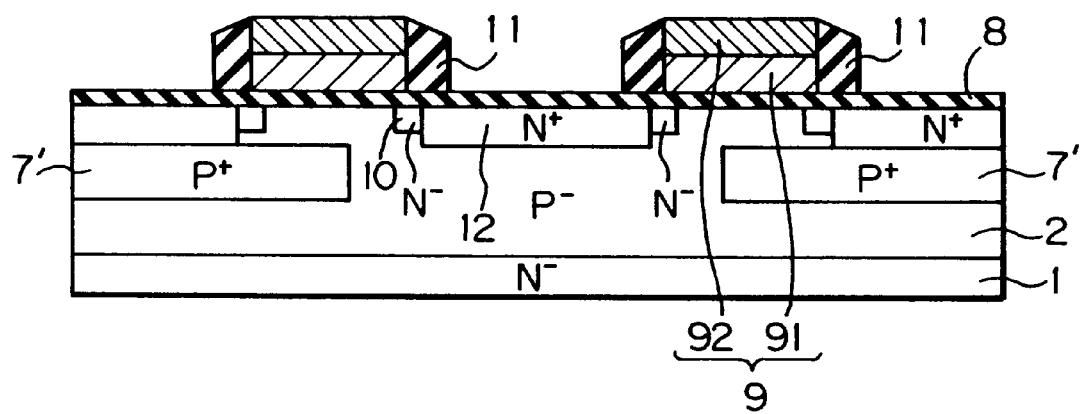

Next, referring to FIGS. 22A, 22B and 22C, in the same way as in FIGS. 13A, 13B and 13C, a gate silicon oxide layer 8 is formed by thermally oxidizing the P$^-$-type well 2. Then, a gate electrode layer 9 formed by a polycrystalline silicon layer 91 and a tungsten silicide layer 92 is formed on the gate silicon oxide layer 8 and the field silicon oxide layer 6. Note that the gate electrode layer 9 also forms word lines $WL_i$ and $WL_i'$. Then, phosphorous ions are implanted into the P$^-$-type well 2 using the gate electrode layer 9 as a mask to form N$^-$-type impurity diffusion regions 10 of an LDD configuration. Then, a silicon oxide layer is formed on the entire surface, and an isotropic etching operation is performed upon the silicon oxide layer to form sidewall silicon oxide layers 11. Then, arsenic ions are implanted into the substrate 1 using the sidewall silicon oxide layers 6 as a mask to form N$^+$-type impurity diffusion regions 12 of the LDD configuration.

Figure 23A:
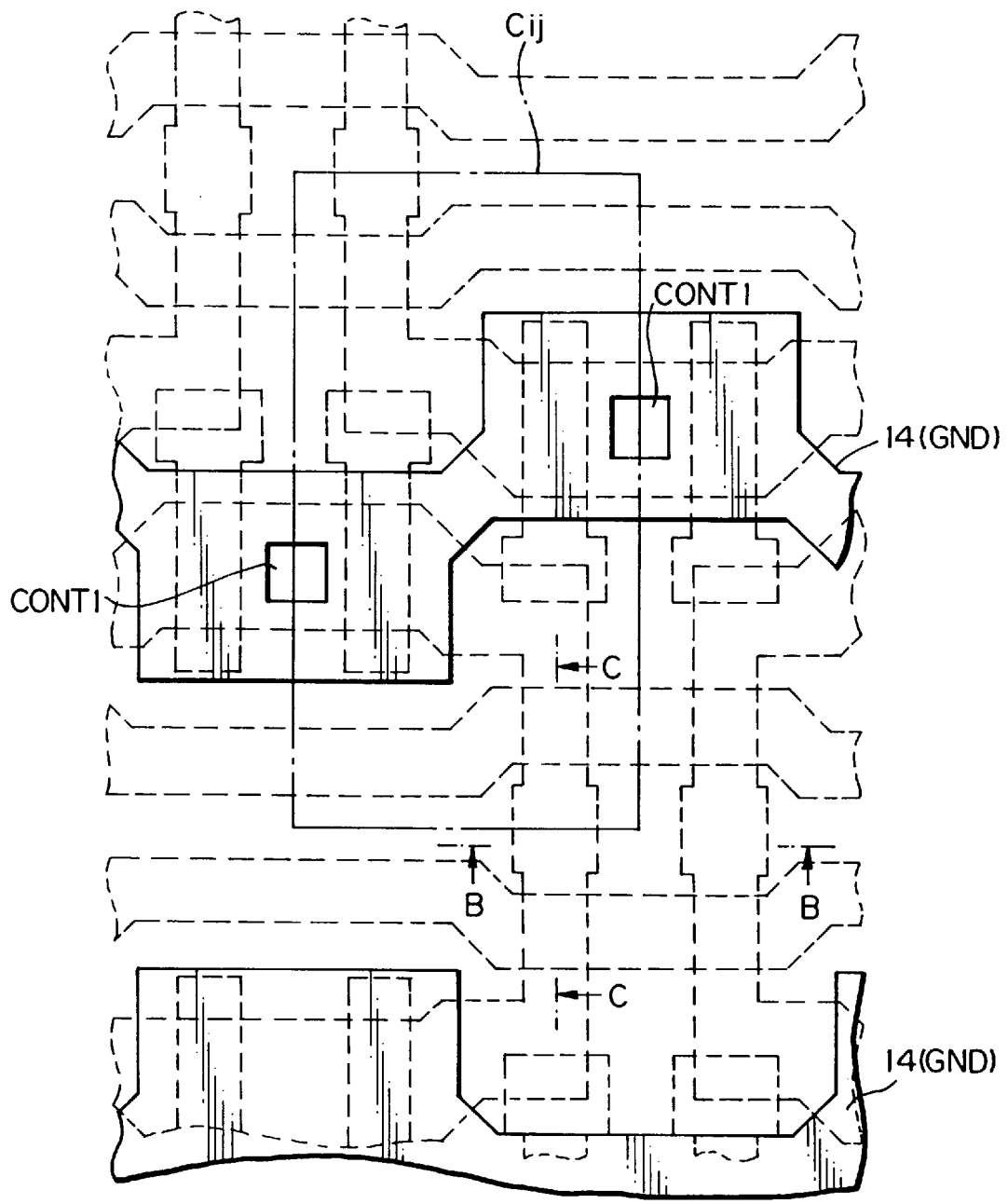
Figure 23B:
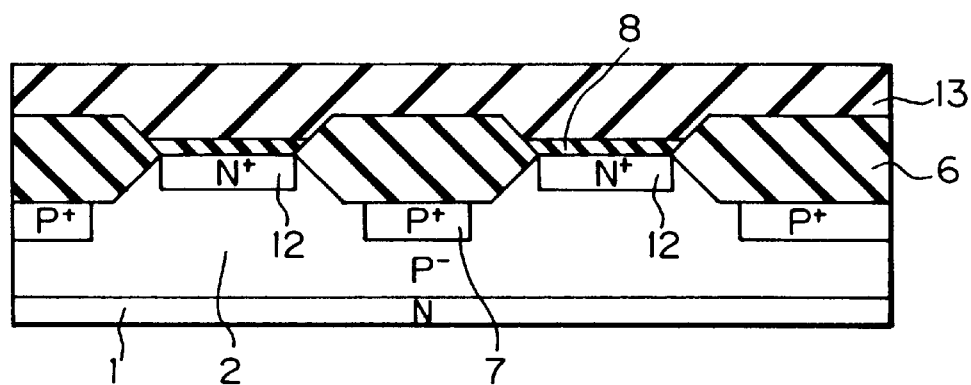
Figure 23C:
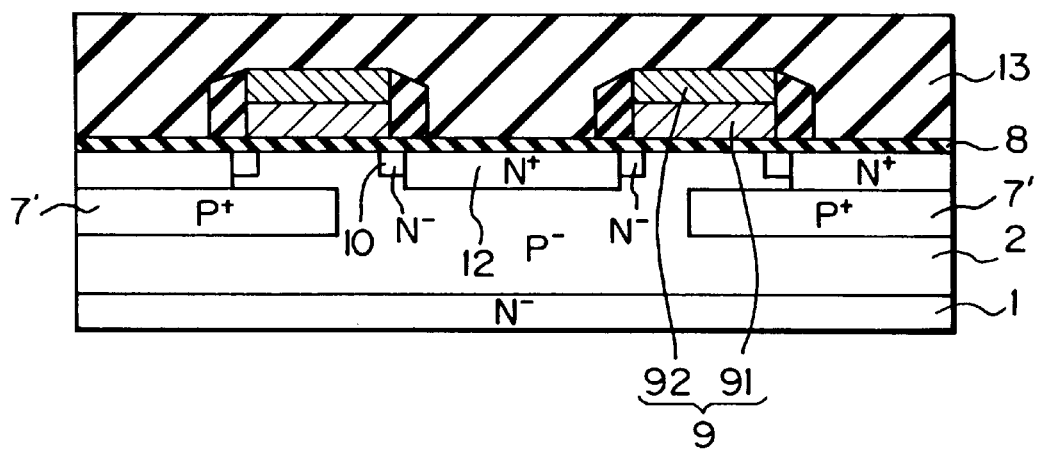

Next, referring to FIGS. 23A, 23B and 23C, in the same way as in FIGS. 14A, 14B and 14C, a silicon oxide layer 13 is deposited on the entire surface by a CVD process, and contact holes CONT1 are perforated in the silicon oxide layer 13. Then, a tungsten silicide layer 14 is formed on the silicon oxide layer 13 by a sputtering process, and is patterned to form a ground line GND. In this case, the ground line GND is connected via the contact holes CONT1 to the sources (the N$^+$-type impurity regions 12) of the drive transistors $Q_{d1}$ and $Q_{d2}$.

Figure 24A:
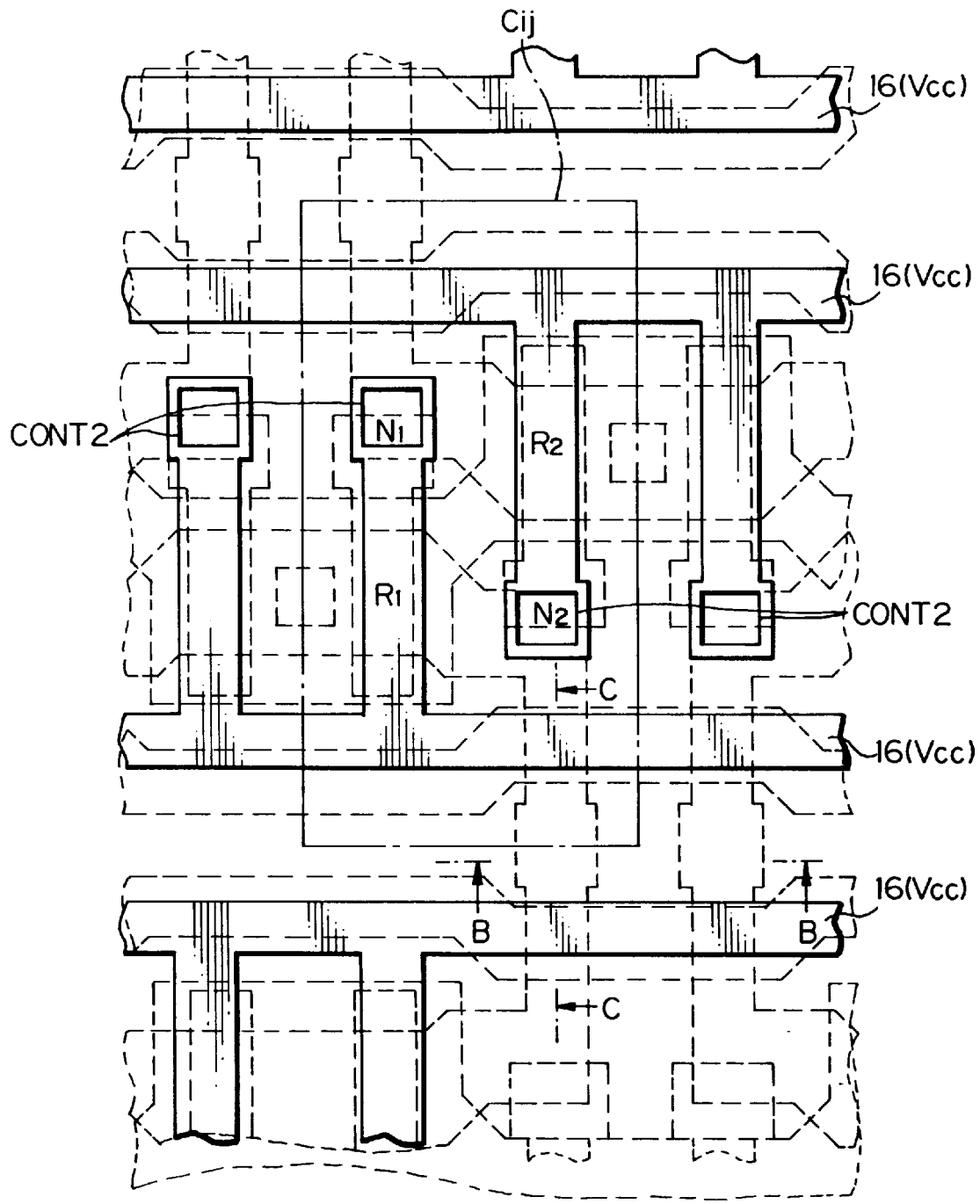
Figure 24B:
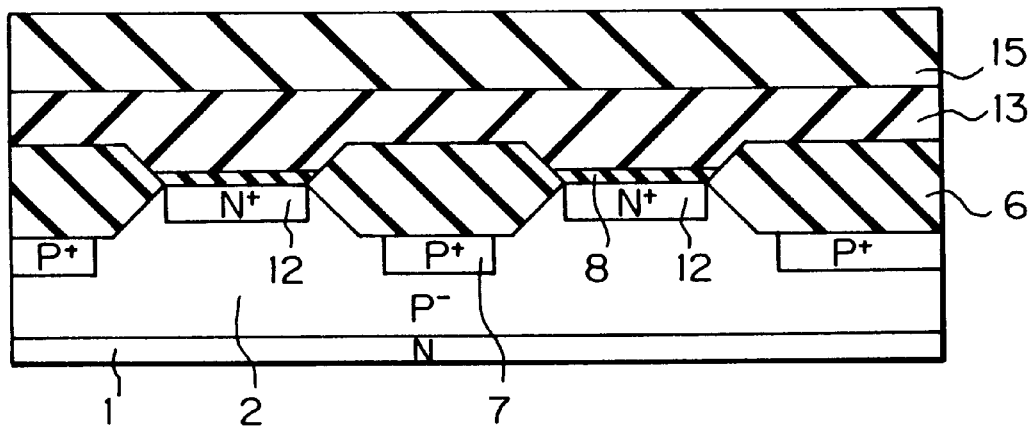
Figure 24C:
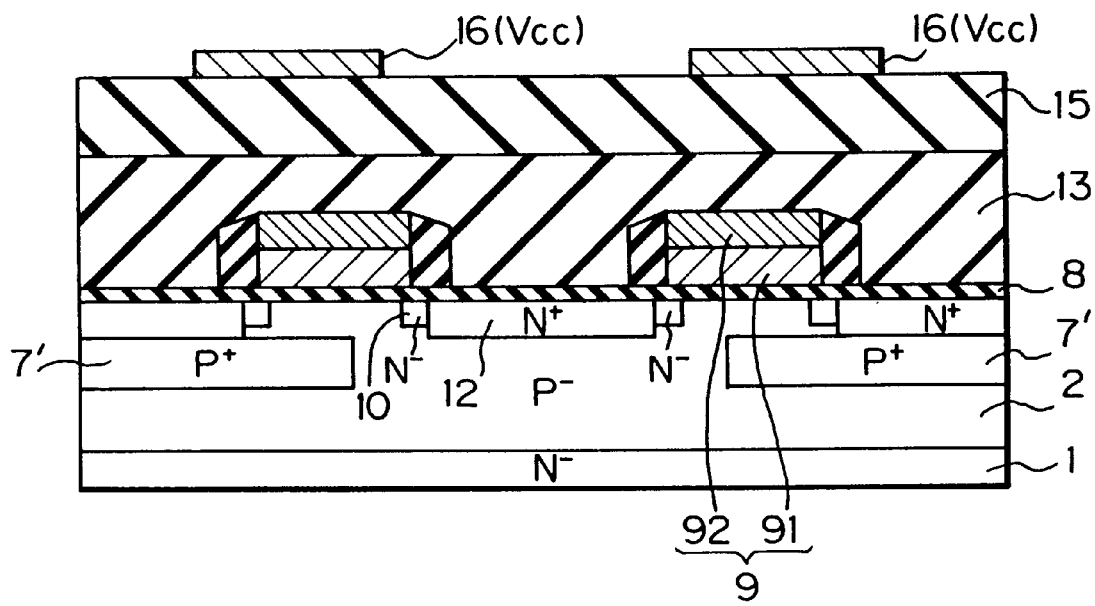

Next, referring to FIGS. 24A, 24B and 24C, in the same way as in FIGS. 15A, 15B and 15C, a silicon oxide layer 15 is deposited on the entire surface by a CVD process, and contact holes CONT2 are perforated in the silicon oxide layers 15 and 13. Then, a polycrystalline silicon layer 16 is formed on the silicon oxide layer 15 by a CVD process, and is patterned to form a power supply line $V_{cc}$ and load resistors $R_1$ and $R_2$. In this case, the load resistors $R_1$ and $R_2$ are connected via the contact holes CONT2 to the nodes $N_1$ and $N_2$ as well as the gates of the drive transistors $Q_{d2}$ and $Q_{d1}$.

Figure 25A:
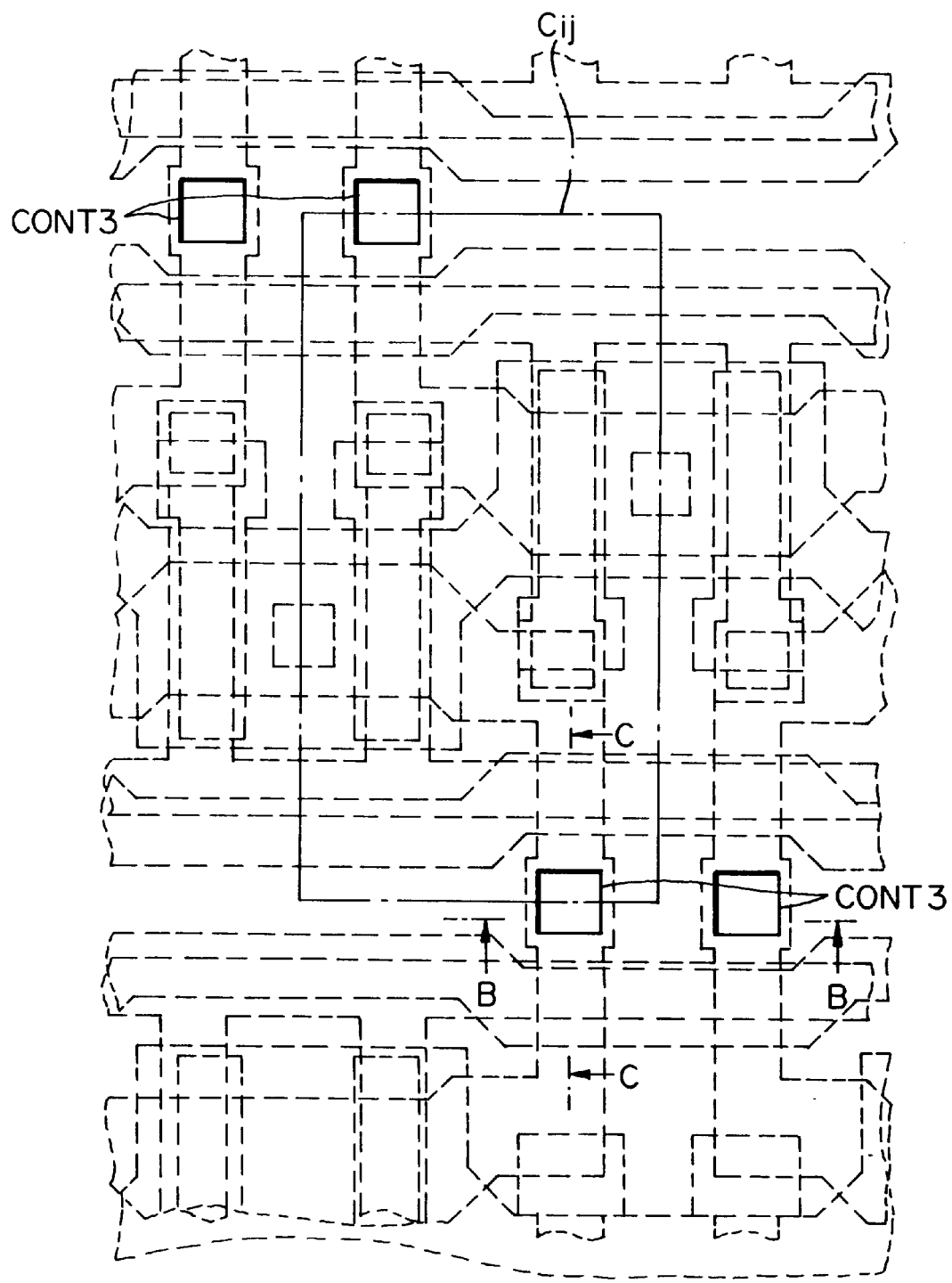
Figure 25B:
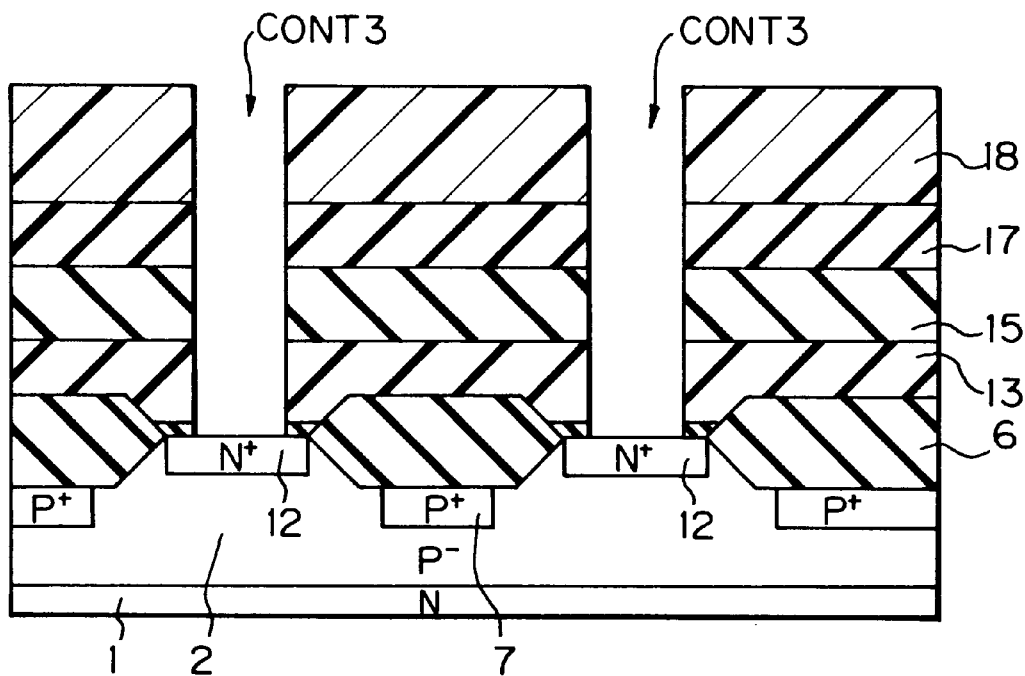
Figure 25C:
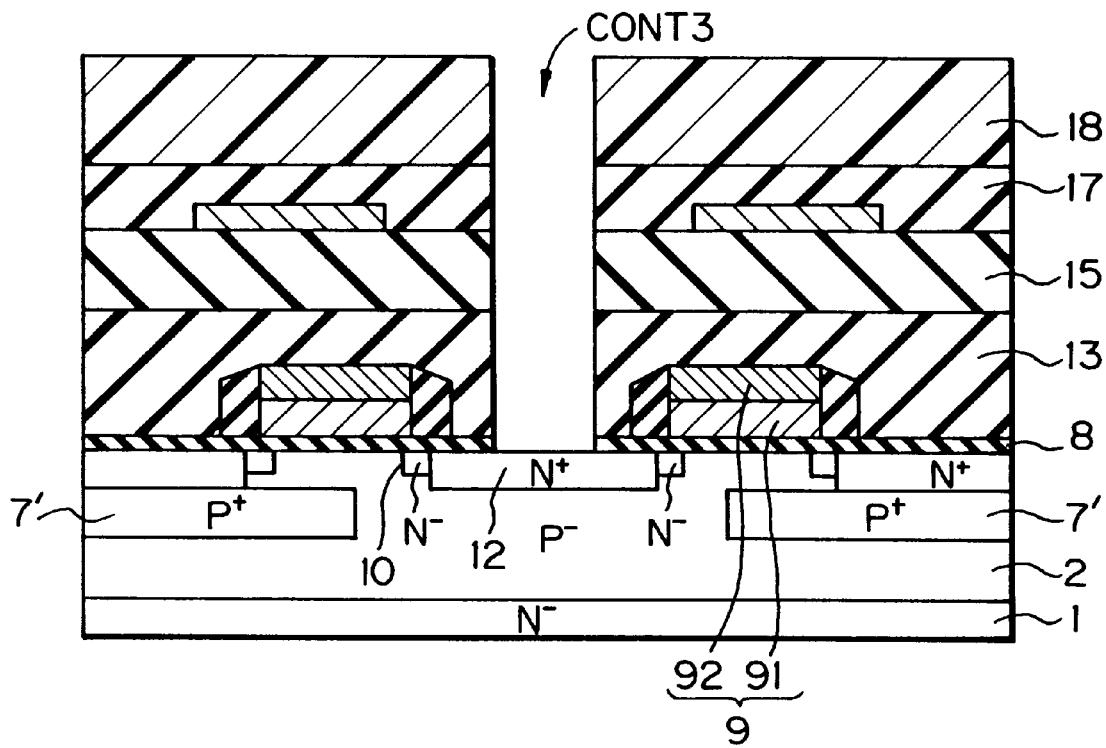

Next, referring to FIGS. 25A, 25B and 25C, in the same way as in FIGS. 16A, 16B and 16C, a silicon oxide layer 17 is deposited on the entire surface by a CVD process. Then, a photoresist pattern 17 is formed and the silicon oxide layers 17, 15, 13 and 8 are anisotropically etched by using the photoresist pattern 18 as a mask to form contact holes CONT3. Then, the photoresist pattern 18 is removed.

Figure 26A:
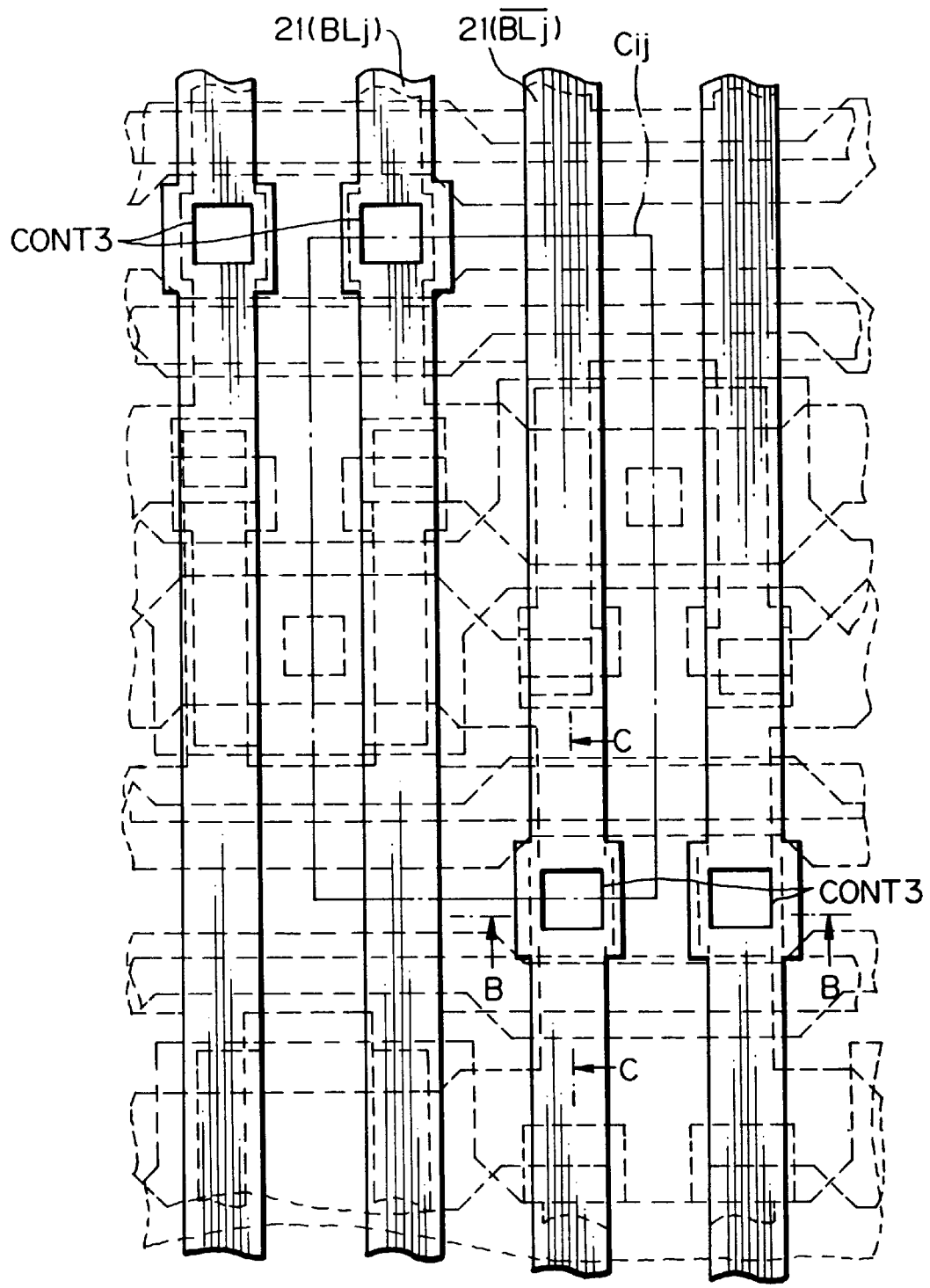
Figure 26B:
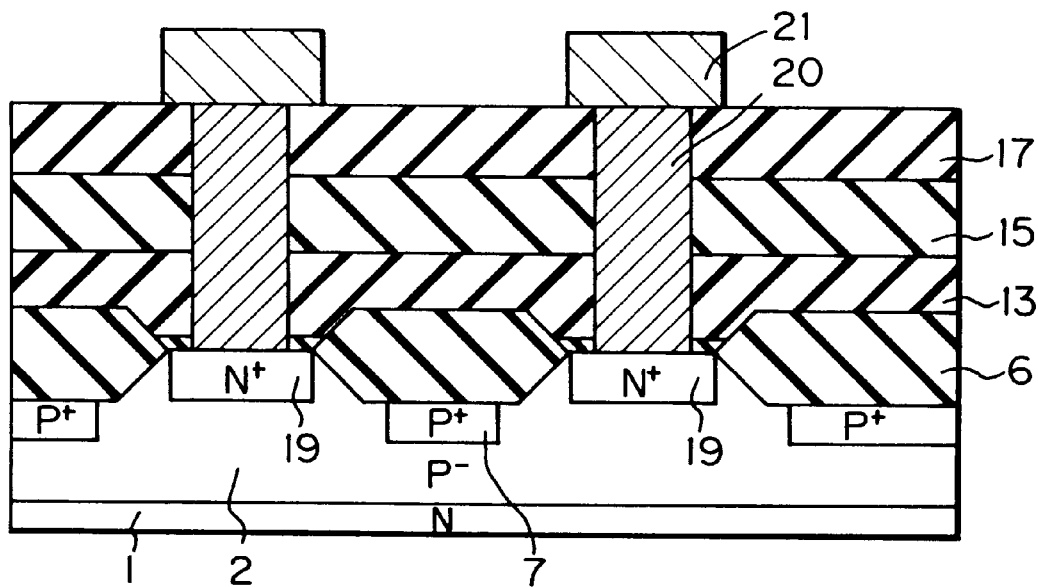
Figure 26C:
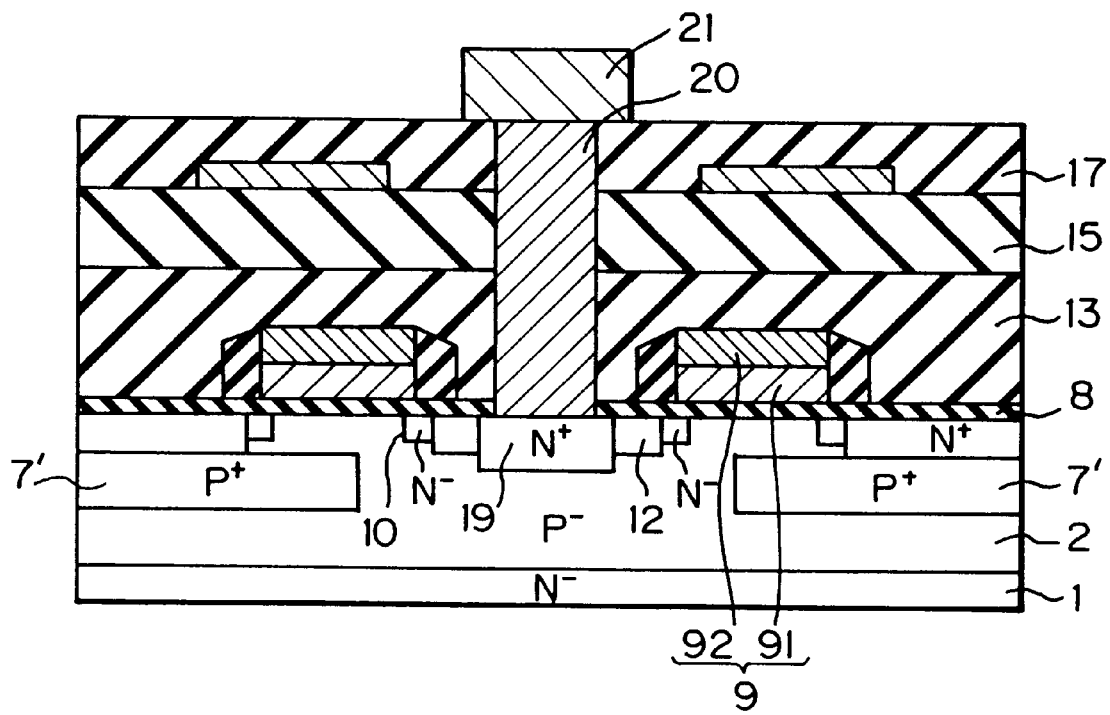

Next, referring to FIGS. 26A, 26B and 26C, in the same way as in FIGS. 17A, 17B and 17C, phosphorous ions are implanted into the P$^-$-type well 2 by the silicon oxide layers 17, 15, 13 and 8 as a mask and the device is annealed, so that an $N^+$-type impurity diffusion region 19 is formed. Then, a tungsten layer is formed by a sputtering process, and the tungsten layer is etched back by an anistropic etching process, so that tungsten plugs 20 are buried in the contact holes CONT3.

Finally, referring to FIGS. 26A, 26B and 26C, in the same way as in FIGS. 17A, 17B and 17C, an aluminum layer 21 is deposited on the entire surface by a sputtering process, and the aluminum layer 21 is patterned to form bit lines $BL_j$ and $\overline{BL_j}$.

Figure 27:
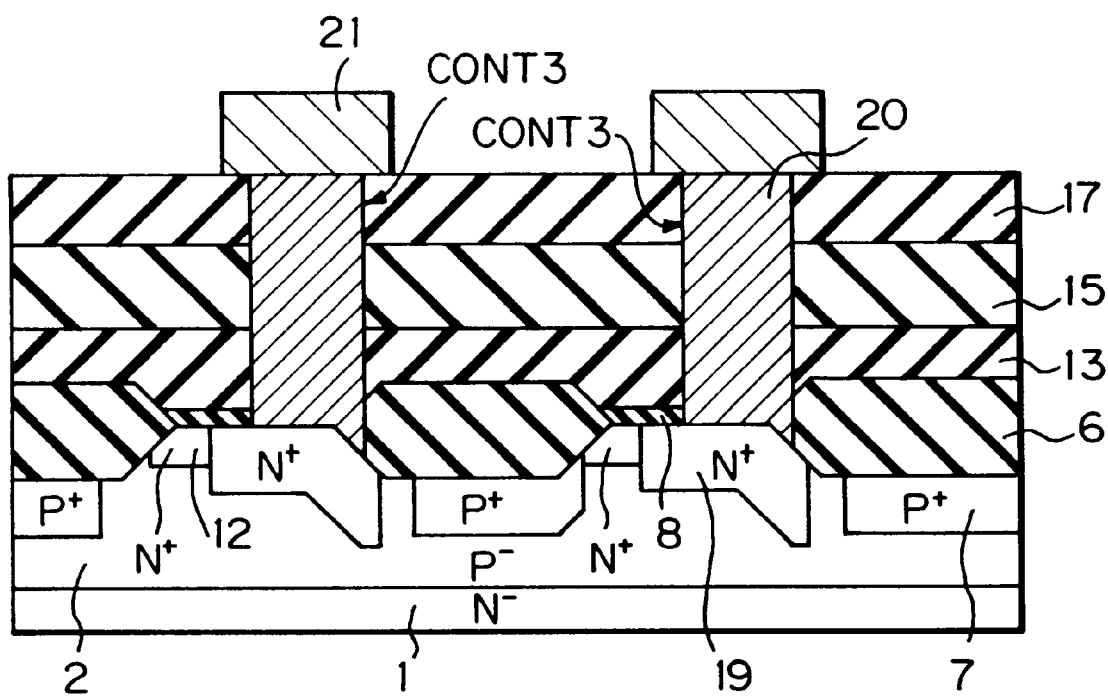
FIG. 27 is a cross-sectional view illustrating a modification of FIG. 26B.

In FIGS. 26A, 26B and 26C, in the same way as in FIGS. 17A, 17B and 17C, the $N^+$-type impurity diffusion region 19 prevents the tungsten plugs 20 from being short-circuited to the $P^+$-type channel stopper region 7. For example, as illustrated in FIG. 27, which is a modification of FIG. 26B, even if the contact holes CONT3 are shifted from optimum locations, the $N^+$-type impurity diffusion region 19 is always formed in self-alignment with the tungsten plug 20. Therefore, the tungsten plugs 20 are never directly connected to the $P^+$-type channel stopper region 7.

In addition, since the $N^+$-type impurity diffusion region 19 is apart from the $P^+$-type channel stopper region 7, a capacitance caused by a PN junction formed by the low impurity concentration $P^-$-type well 2 and the high impurity concentration $N^4$-type impurity diffusion region 19 is remarkably decreased. This decreases the parasitic capacitance of the aluminum layer 20 connected to this PN junction, thus increasing the operation of the device.

As explained hereinabove, according to the present invention, since the parasitic capacitance of a conductive (wiring) layer connected via a contact plug to an impurity diffusion region can be decreased, the operation of the device can be enhanced.

What is claimed is:

1. A semiconductor device comprising:

a semiconductor substrate of a first conductivity type;

a field insulating layer formed on said semiconductor substrate, said field insulating layer partitioning an active area of said semiconductor substrate;

a channel stopper region of said first conductivity type formed within said semiconductor substrate beneath said field insulating layer, an area of said channel stopper region being smaller than an area of said field insulating layer;

a first impurity diffusion region of a second conductivity type, formed within said semiconductor substrate in said active area;

a second impurity diffusion region of said second conductivity type, formed within said semiconductor substrate in said active area;

a gate insulating layer formed on said semiconductor substrate in said active area between said first and second impurity diffusion regions;

a gate electrode layer formed on said gate insulating layer; and a third impurity diffusion region of said first conductivity type formed beneath said second impurity diffusion region.

* * * * *